(12) United States Patent
Tinnemans et al.

(10) Patent No.: US 10,346,729 B2
(45) Date of Patent: Jul. 9, 2019

(54) APPARATUS AND METHOD FOR CONVERTING A VECTOR-BASED REPRESENTATION OF A DESIRED DEVICE PATTERN FOR A LITHOGRAPHY APPARATUS, APPARATUS AND METHOD FOR PROVIDING DATA TO A PROGRAMMABLE PATTERNING DEVICE, A LITHOGRAPHY APPARATUS AND A DEVICE MANUFACTURING METHOD

(71) Applicant: ASML Netherlands B.V., Veldhoven (NL)

(72) Inventors: Patricius Aloysius Jacobus Tinnemans, Hapert (NL); Marcel Bontekoe, Veldhoven (NL); Patrick Petrus Albertus Arnoldino Peeters, Beers (NL)

(73) Assignee: ASML Netherlands B.V., Veldhoven (NL)

( * ) Notice: Subject to any disclaimer, the term of this patent is extended or adjusted under 35 U.S.C. 154(b) by 470 days.

(21) Appl. No.: 14/350,320

(22) PCT Filed: Nov. 13, 2012

(86) PCT No.: PCT/EP2012/072497
§ 371 (c)(1),
(2) Date: Apr. 7, 2014

(87) PCT Pub. No.: WO2013/079316
PCT Pub. Date: Jun. 6, 2013

(65) Prior Publication Data
US 2014/0240732 A1     Aug. 28, 2014

Related U.S. Application Data

(60) Provisional application No. 61/564,661, filed on Nov. 29, 2011, provisional application No. 61/591,647, (Continued)

(51) Int. Cl.
G03F 7/20 (2006.01)
G06K 15/02 (2006.01)

(52) U.S. Cl.
CPC ..... G06K 15/1836 (2013.01); G03F 7/70291 (2013.01); G03F 7/70508 (2013.01)

(58) Field of Classification Search
CPC ............ G03F 7/70508; G03F 7/70291; G06K 15/1836
See application file for complete search history.

(56) References Cited

U.S. PATENT DOCUMENTS 4,090,206 A   5/1978   Pfeifer
4,447,126 A   5/1984   Heidrich
(Continued)

FOREIGN PATENT DOCUMENTS

DE   4315580   11/1994
DE   4315581   11/1994
(Continued)

OTHER PUBLICATIONS

Korean Office Action dated Oct. 22, 2015 in Korean Patent Application No. 10-2014-7016574.
(Continued)

*Primary Examiner* — Wyatt A Stoffa
(74) *Attorney, Agent, or Firm* — Pillsbury Winthrop Shaw Pittman LLP

(57) ABSTRACT

A method for converting a vector-based representation of a desired device pattern for an exposure apparatus, a lithography or exposure apparatus, an apparatus and method to
(Continued)

provide data to a programmable patterning device, and a device manufacturing method. In an embodiment, the method for converting outputs a rasterized representation of the desired dose pattern of radiation corresponding to the desired device pattern, wherein the vector-based representation includes primitive data identifying one or more primitive patterns; and instance data identifying how at least a portion of the desired device pattern is formed from one or more instances of each identified primitive pattern, the method including forming a rasterized primitive of each primitive pattern identified in the primitive data, and forming the rasterized representation by storing each rasterized primitive in association with the instance data corresponding to that rasterized primitive.

20 Claims, 13 Drawing Sheets

Related U.S. Application Data filed on Jan. 27, 2012, provisional application No. 61/638,843, filed on Apr. 26, 2012.

(56) References Cited

U.S. PATENT DOCUMENTS

| | | | |
|---|---|---|---|
| 4,520,472 A | 5/1985 | Reno | |
| 4,525,729 A | 6/1985 | Agulnek | |
| 4,640,573 A | 2/1987 | Kataoka | |
| 4,780,730 A | 10/1988 | Dodge | |
| 4,796,038 A * | 1/1989 | Allen | G03F 7/704 |
| | | | 347/255 |
| 4,844,568 A | 7/1989 | Suzuki | |
| 4,864,216 A | 9/1989 | Kalata | |
| 4,952,949 A | 8/1990 | Uebbing | |
| 5,051,762 A | 9/1991 | Lea | |
| 5,216,247 A | 6/1993 | Wang | |
| 5,216,534 A | 6/1993 | Boardman | |
| 5,229,872 A | 7/1993 | Mumola | |
| 5,296,891 A | 3/1994 | Vogt | |
| 5,457,488 A | 10/1995 | Nakamura | |
| 5,481,392 A | 1/1996 | Damer | |
| 5,523,193 A | 6/1996 | Nelson | |
| 5,568,320 A | 10/1996 | Rees | |
| 5,589,973 A | 12/1996 | King | |
| 5,610,754 A | 3/1997 | Gheen | |
| 5,668,587 A | 9/1997 | Hammond | |
| 5,705,788 A | 1/1998 | Beyer | |
| 5,838,024 A | 11/1998 | Masuda | |
| 5,840,451 A | 11/1998 | Moore | |
| 6,037,965 A | 3/2000 | Gross | |
| 6,133,986 A | 10/2000 | Johnson | |
| 6,204,875 B1 | 3/2001 | De Loor | |
| 6,268,613 B1 | 7/2001 | Cantu | |
| 6,310,710 B1 | 10/2001 | Shahar | |
| 6,313,862 B1 | 11/2001 | Berner | |
| 6,466,352 B1 | 10/2002 | Shahar | |
| 6,531,681 B1 | 3/2003 | Markle | |
| 6,559,438 B1 | 5/2003 | Drobot | |
| 6,683,727 B1 | 1/2004 | Goring | |
| 6,765,647 B1 | 7/2004 | Nishi | |
| 6,795,169 B2 | 9/2004 | Tanaka | |
| 6,967,711 B2 | 11/2005 | Gui | |
| 7,116,402 B2 | 10/2006 | Gui | |
| 7,477,772 B2 * | 1/2009 | Makarovic | G03F 7/70291 |
| | | | 382/141 |
| 7,728,956 B2 | 6/2010 | Bleeker et al. | |
| 7,969,636 B2 | 6/2011 | Naito | |
| 2002/0115021 A1 | 8/2002 | Piao | |
| 2002/0126479 A1 | 9/2002 | Zhai | |
| 2002/0171047 A1 | 11/2002 | Chan | |
| 2003/0010937 A1 * | 1/2003 | Jolley | G03F 7/70383 |
| | | | 250/492.22 |
| 2003/0043582 A1 | 3/2003 | Chan | |
| 2003/0091277 A1 | 5/2003 | Mei | |
| 2004/0124372 A1 | 7/2004 | Gil | |
| 2004/0135159 A1 | 7/2004 | Siegel | |
| 2004/0257629 A1 | 12/2004 | Noehte | |
| 2005/0167508 A1 | 8/2005 | Syms | |
| 2006/0001855 A1 | 1/2006 | Lof | |
| 2006/0055903 A1 * | 3/2006 | Thuren | G03F 7/70291 |
| | | | 355/53 |
| 2006/0103719 A1 | 5/2006 | Katzir | |
| 2006/0108508 A1 | 5/2006 | Khalid | |
| 2006/0132750 A1 | 6/2006 | Gui et al. | |
| 2006/0221320 A1 | 10/2006 | Bleeker et al. | |
| 2006/0269116 A1 * | 11/2006 | Makarovic | G03F 7/70291 |
| | | | 382/141 |
| 2007/0034890 A1 | 2/2007 | Daschner | |
| 2007/0182808 A1 | 8/2007 | Stiblert | |
| 2007/0296936 A1 | 12/2007 | Kato | |
| 2007/0296942 A1 | 12/2007 | Tinnemans | |
| 2008/0042969 A1 | 2/2008 | Baker | |
| 2008/0047445 A1 | 2/2008 | Berner | |
| 2008/0137051 A1 | 6/2008 | Maly | |
| 2008/0160211 A1 | 7/2008 | Siegel | |
| 2008/0210888 A1 * | 9/2008 | Inoue | G03F 7/70225 |
| | | | 250/492.22 |
| 2009/0161173 A1 | 6/2009 | Mushano | |
| 2009/0296063 A1 | 12/2009 | Opower | |
| 2010/0142757 A1 | 6/2010 | Sandstrom | |
| 2010/0265557 A1 | 10/2010 | Sallander | |
| 2011/0051211 A1 | 3/2011 | Walther | |
| 2011/0188016 A1 | 8/2011 | De Jager | |
| 2012/0286173 A1 * | 11/2012 | Van De Peut | B82Y 10/00 |
| | | | 250/492.1 |
| 2014/0071421 A1 | 3/2014 | De Jager et al. | |

FOREIGN PATENT DOCUMENTS

| | | |
|---|---|---|
| DE | 19813127 | 10/1998 |
| EP | 1 835 347 | 9/2007 |
| JP | 57-152273 | 9/1982 |
| JP | 06-275936 | 9/1994 |
| JP | 2003-220484 | 8/2003 |
| JP | 2005-521071 | 7/2005 |
| JP | 2005-521253 | 7/2005 |
| JP | 2006-293352 | 10/2006 |
| JP | 2006-338000 | 12/2006 |
| JP | 2007-094116 | 4/2007 |
| WO | 97/34171 | 9/1997 |
| WO | 98/33096 | 7/1998 |
| WO | 98/38597 | 9/1998 |
| WO | 03/081338 | 10/2003 |
| WO | 2005/006082 | 1/2005 |
| WO | 2006/002668 | 1/2006 |
| WO | 2006/064363 | 6/2006 |
| WO | 2007/50022 | 5/2007 |
| WO | 2007/50023 | 5/2007 |
| WO | 2007/98935 | 9/2007 |
| WO | 2008/071347 | 6/2008 |
| WO | 2008/125692 | 10/2008 |
| WO | 2010/032224 | 3/2010 |
| WO | 2010/134018 | 11/2010 |
| WO | 2010/151123 | 12/2010 |
| WO | 2011/026610 | 3/2011 |
| WO | 2013/023874 | 2/2013 |

OTHER PUBLICATIONS

LOT-Oriel Group Europe, "MicroWriter™ Laser Lithography System," www.LOT-Oriel.com (2 pp, date unknown, obtained Jul. 2010).

"Large-Plate Exposure System FX-63S," Nikon Web Magazine: Nikon Technology Outlook, Sep. 24, 2004, pp. 1-4.

JetScreen DX Flat Brochure (6 pp., date unknown, obtained Feb. 2009).

International Search Report dated Jun. 11, 2013 in corresponding International Patent Application No. PCT/EP2012/072497.

(56) References Cited

OTHER PUBLICATIONS

"Lithographic Apparatus and Device Manufacturing Method," Research Disclosure, Mason Publications, Hampshire, GB, vol. 551, No. 29, Mar. 1, 2010, p. 322, XP007139689, ISSN: 0374-4353.
International Preliminary Report on Patentability dated Jun. 12, 2014 in corresponding International Patent Application No. PCT/EP2012/072497.
Japanese Office Action dated Aug. 4, 2015 in corresponding Japanese Patent Application No. 2014-542769.

* cited by examiner

APPARATUS AND METHOD FOR CONVERTING A VECTOR-BASED REPRESENTATION OF A DESIRED DEVICE PATTERN FOR A LITHOGRAPHY APPARATUS, APPARATUS AND METHOD FOR PROVIDING DATA TO A PROGRAMMABLE PATTERNING DEVICE, A LITHOGRAPHY APPARATUS AND A DEVICE MANUFACTURING METHOD

CROSS-REFERENCE TO RELATED APPLICATIONS

This application is the U.S. national phase entry of PCT patent application no. PCT/EP2012/072497, which was filed on Nov. 13, 2012, which claims the benefit of priority of U.S. provisional application No. 61/564,661, which was filed on Nov. 29, 2011, and of U.S. provisional application No. 61/591,647, which was filed on Jan. 27, 2012, and of U.S. provisional application No. 61/638,843, which was filed on Apr. 26, 2012, each of which are incorporated herein in its entirety by reference.

FIELD

The present invention relates to a method for converting a vector-based representation of a desired dose pattern for a lithographic or exposure apparatus, a lithographic or exposure apparatus, an apparatus and method to provide data to a programmable patterning device, and a method for manufacturing a device.

BACKGROUND

A lithographic apparatus is a machine that applies a desired pattern onto a substrate or part of a substrate. A lithographic apparatus may be used, for example, in the manufacture of integrated circuits (ICs), flat panel displays and other devices or structures having fine features. In a conventional lithographic apparatus, a patterning device, which may be referred to as a mask or a reticle, may be used to generate a circuit pattern corresponding to an individual layer of the IC, flat panel display, or other device). This pattern may transferred on (part of) the substrate (e.g. silicon wafer or a glass plate), e.g. via imaging onto a layer of radiation-sensitive material (resist) provided on the substrate.

Instead of a circuit pattern, the patterning device may be used to generate other patterns, for example a color filter pattern, or a matrix of dots. Instead of a conventional mask, the patterning device may comprise a patterning array that comprises an array of individually controllable elements that generate the circuit or other applicable pattern. An advantage of such a "maskless" system compared to a conventional mask-based system is that the pattern can be provided and/or changed more quickly and for less cost.

Thus, a maskless system includes a programmable patterning device (e.g., a spatial light modulator, a contrast device, etc.). The programmable patterning device is programmed (e.g., electronically or optically) to form the desired patterned beam using the array of individually controllable elements. Types of programmable patterning devices include micro-mirror arrays, liquid crystal display (LCD) arrays, grating light valve arrays, arrays of self-emissive contrast devices, a shutter element matrix, and the like. A programmable patterning device could also be formed from an electro-optical deflector, configured for example to move spots of radiation projected onto the substrate or to intermittently direct a radiation beam away from the substrate, for example to a radiation beam absorber. In either such arrangement, the radiation beam may be continuous.

SUMMARY

A desired device pattern to be formed on a substrate may be defined using a vector design package, such as GDSII. The output file from such a design package may be referred to as a vector-based representation of the desired device pattern. In a maskless system, the vector-based representation will be processed to provide a control signal to drive a programmable patterning device. The control signal may comprise a sequence of setpoints (e.g. voltages or currents) to be applied to a plurality of, for example, self-emissive contrast devices.

The processing to convert the vector-based representation to the control signal may comprise one or more steps of converting the vector-based representation to a rasterized representation of the dose pattern. The processing may comprise one or more steps of correcting for alignment variations of the substrate and/or of previously formed patterns on the substrate, relative to the patterning device. The processing may comprise one or more steps of converting the rasterized representation to a sequence of setpoint values. The processing may involve complex calculations and/or large data volumes. For steps in the processing that are carried out in real time (e.g. at the same time as the pattern is being formed on or in the substrate), the calculations should be completed quickly. This tends to increase the cost of the processing hardware and/or reduce the throughput of the lithographic or exposure apparatus.

The desired device pattern may have a large degree of repetition. Such repetition may be exploited by the vector-based representation, using hierarchy for example, to keep the size of the vector-based representation relatively small. However, the rasterized representation will tend to be much larger. Handling the rasterized representation efficiently is therefore expensive and/or rate limiting. Data processing to remove the hierarchy can also be expensive and/or rate limited because the hierarchy makes it difficult to store portions of the representation in the order in which they will be used during the exposure process.

The nature of the desired device pattern may vary significantly from one pattern to the next pattern and/or within the pattern itself. For example, a certain region may correspond to a device feature requiring a relatively low resolution dose pattern and another region may correspond to a device feature requiring a higher resolution dose pattern. It is difficult to configure the rasterization process to work optimally for all patterns and for all regions within patterns. Computational resources to obtain the rasterized representation and/or to store or process the rasterized representation, for example in an online part of the data-path, may therefore not be used optimally, resulting in possible lower output quality, lower throughput and/or increased cost.

It is desirable, for example, to provide a method and/or apparatus that increases the efficiency with which the data-path processing is carried out.

According to an embodiment of the invention, there is provided a method for converting a vector-based representation of a desired device pattern to be formed on a substrate using an exposure apparatus to a rasterized representation of the desired dose pattern of radiation corresponding to the desired device pattern, wherein the vector-based representation comprises primitive data identifying one or more primitive patterns and instance data identifying how at least a portion of the desired device pattern is formed from one or more instances of each identified primitive pattern, the method comprising: forming a rasterized primitive of each primitive pattern identified in the primitive data; and forming the rasterized representation by storing each rasterized primitive in association with the instance data corresponding to that rasterized primitive.

According to an embodiment of the invention, there is provided an exposure apparatus, comprising: a projection system, configured to project a plurality of beams onto a substrate; and a data processing system configured to convert a rasterized representation of a desired dose pattern to a sequence of setpoint data to control the plurality of beams, wherein the rasterized representation is formed by converting a vector-based representation of a desired device pattern to be formed on the substrate to a rasterized representation of the desired dose pattern of radiation corresponding to the desired device pattern, the vector-based representation comprising primitive data identifying one or more primitive patterns and instance data identifying how the desired device pattern is formed from instances of each identified primitive pattern, and wherein the conversion comprises forming a rasterized primitive of each primitive pattern identified in the primitive data; and forming the rasterized representation by storing each rasterized primitive in association with the instance data corresponding to that rasterized primitive.

According to an embodiment of the invention, there is provided an exposure apparatus, comprising: a projection system, configured to project a plurality of beams onto a substrate; and a data processing system configured to convert a rasterized representation of a desired dose pattern to a sequence of setpoint data to control the plurality of beams, the data processing system comprising a plurality of processing units, each processing unit configured to convert a different portion of the rasterized representation, each different portion corresponding to a different strip of a substrate, each different strip aligned parallel to a scanning direction of the substrate relative to the projection system.

According to an embodiment of the invention, there is provided a device manufacturing method comprising: converting a vector-based representation of a desired device pattern to be formed on a substrate using an exposure apparatus to a rasterized representation of the desired dose pattern of radiation corresponding to the desired device pattern, wherein the vector-based representation comprises primitive data identifying one or more primitive patterns and instance data identifying how the desired device pattern is formed from instances of each identified primitive pattern, and wherein the converting the vector-based representation comprises forming a rasterized primitive of each primitive pattern identified in the primitive data, and forming the rasterized representation by storing each rasterized primitive in association with the instance data corresponding to that rasterized primitive; converting the rasterized representation to a sequence of setpoint data for the apparatus; and using the apparatus to project a dose pattern onto a target using the setpoint data.

According to an embodiment of the invention, there is provided an apparatus to provide data to a programmable patterning device of an exposure apparatus, comprising: a buffer memory configured to receive a plurality of data units, each data unit representing the pattern to be formed in a different portion of a desired dose pattern, wherein the buffer memory is configured to output the data units as needed to provide a control signal to the programmable patterning device during exposure of a substrate by the exposure apparatus; and a flow controller configured to control the transfer of the data units to and/or from the buffer memory such that each data unit is stored in the buffer memory for a time period shorter than the time necessary to expose the complete desired dose pattern.

According to an embodiment, there is provided a method of providing data to a programmable patterning device of an exposure apparatus, the method comprising: in a buffer memory, receiving a plurality of data units, each data unit representing the pattern to be formed in a different portion of a desired dose pattern; outputting the data units from the buffer memory as needed to provide a control signal to the programmable patterning device during exposure of a substrate by the exposure apparatus; and controlling the transfer of the data units to and/or from the buffer memory such that each data unit is stored in the buffer memory for a time period shorter than the time necessary to expose the complete desired dose pattern.

According to an embodiment, there is provided a method of converting a vector-based representation of a desired device pattern to be formed on a substrate using an exposure apparatus to a rasterized or sampled representation of the desired dose pattern of radiation corresponding to the desired device pattern, wherein: a dose pattern corresponding to a region of the desired device pattern is formed using a rasterized or sampled representation of the region, the rasterized or sampled representation of the region defined relative to a rasterization or sampling grid defining the points or locations at which the rasterized or sampled representation defines dose values in the region, the method comprising: analyzing 1) the region of the desired device pattern to obtain a measure of a computational requirement to obtain, to store or to process the rasterized or sampled representation of the region, or 2) a simulated or actual dose pattern produced by the exposure apparatus using the rasterized or sampled representation of the region to obtain a measure of image quality; modifying the rasterization or sampling grid in response to the results of the analyzing; and using the modified rasterization or sampling grid to convert the vector-based representation of the desired dose pattern.

According to an embodiment, there is provided an apparatus to convert a vector-based representation of a desired device pattern to be formed on a substrate using an exposure apparatus to a rasterized or sampled representation of the desired dose pattern of radiation corresponding to the desired device pattern, wherein: a dose pattern corresponding to a region of the desired device pattern is formed using a rasterized or sampled representation of the region, the rasterized or sampled representation of the region defined relative to a rasterization or sampling grid defining the points or locations at which the rasterized or sampled representation defines dose values in the region, the apparatus comprising a data processing device configured to: analyze 1) the region of the desired device pattern to obtain a measure of a computational requirement to obtain, to store or to process the rasterized or sampled representation of the region, or 2) a simulated or actual dose pattern produced by the exposure apparatus using the rasterized or sampled representation of the region to obtain a measure of image quality; modify the rasterization or sampling grid in response to the results of the analyzing; and use the modified rasterization or sampling grid to convert the vector-based representation.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

An embodiment of the present invention relates to an apparatus that may include a programmable patterning device that may, for example, be comprised of an array or arrays of self-emissive contrast devices. Further information regarding such an apparatus may be found in PCT patent application publication no. WO 2010/032224 A2, U.S. patent application publication no. US 2011-0188016, U.S. patent application No. 61/473,636 and U.S. patent application No. 61/524,190 which are hereby incorporated by reference in their entireties. An embodiment of the present invention, however, may be used with any form of programmable patterning device including, for example, those discussed above.

Figure 1:
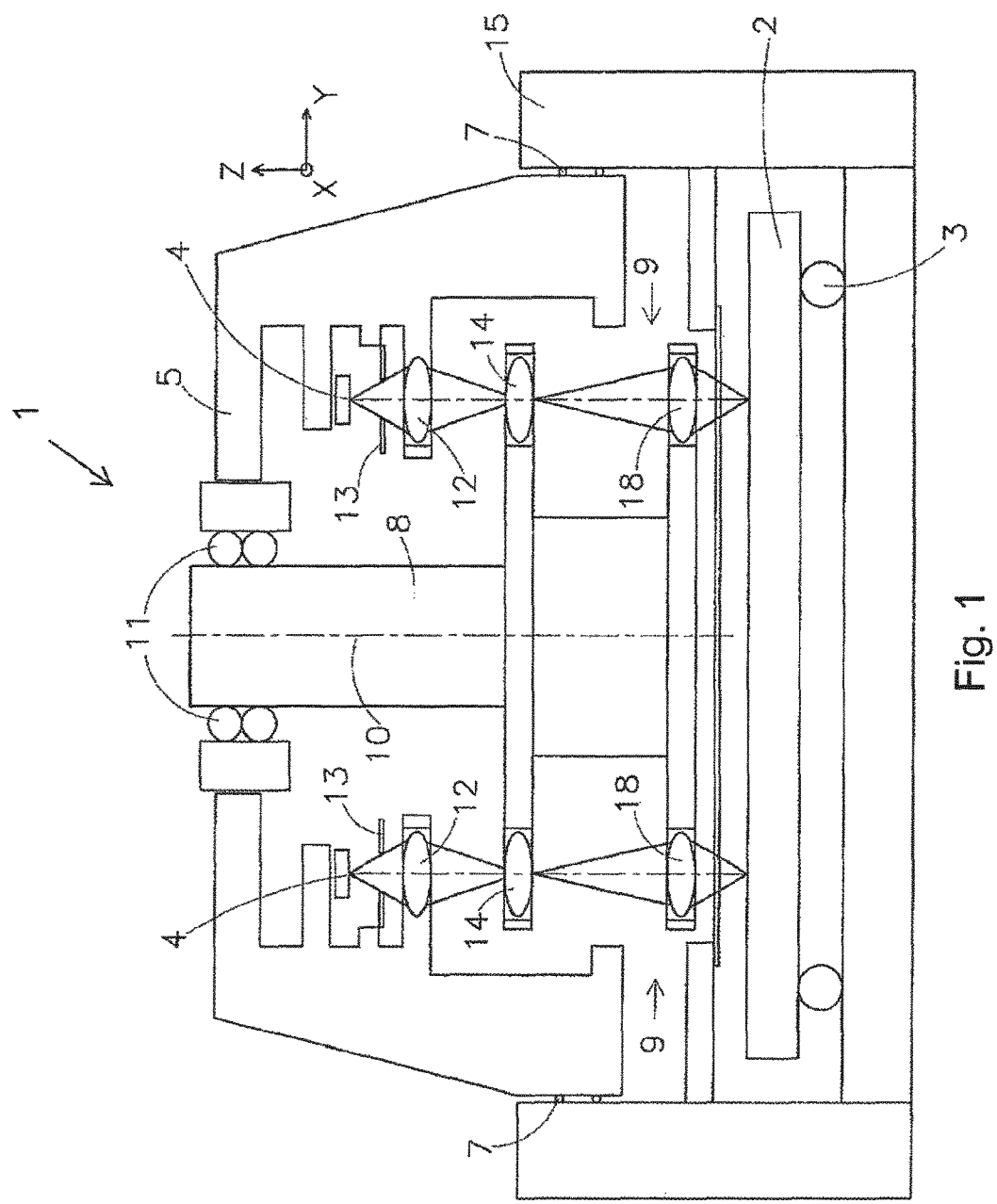
FIG. 1 depicts a part of a lithographic or exposure apparatus according to an embodiment of the invention.

FIG. 1 schematically depicts a schematic cross-sectional side view of a part of a lithographic or exposure apparatus. In this embodiment, the apparatus has individually controllable elements substantially stationary in the X-Y plane as discussed further below although it need not be the case. The apparatus 1 comprises a substrate table 2 to hold a substrate, and a positioning device 3 to move the substrate table 2 in up to 6 degrees of freedom. The substrate may be a resist-coated substrate. In an embodiment, the substrate is a wafer. In an embodiment, the substrate is a polygonal (e.g. rectangular) substrate. In an embodiment, the substrate is a glass plate. In an embodiment, the substrate is a plastic substrate. In an embodiment, the substrate is a foil. In an embodiment, the apparatus is suitable for roll-to-roll manufacturing.

The apparatus 1 further comprises a plurality of individually controllable self-emissive contrast devices 4 configured to emit a plurality of beams. In an embodiment, the self-emissive contrast device 4 is a radiation emitting diode, such as a light emitting diode (LED), an organic LED (OLED), a polymer LED (PLED), or a laser diode (e.g., a solid state laser diode). In an embodiment, each of the individually controllable elements 4 is a blue-violet laser diode (e.g., Sanyo model no. DL-3146-151). Such diodes may be supplied by companies such as Sanyo, Nichia, Osram, and Nitride. In an embodiment, the diode emits UV radiation, e.g., having a wavelength of about 365 nm or about 405 nm. In an embodiment, the diode can provide an output power selected from the range of 0.5-200 mW. In an embodiment, the size of laser diode (naked die) is selected from the range of 100-800 micrometers. In an embodiment, the laser diode has an emission area selected from the range of 0.5-5 micrometers$^2$. In an embodiment, the laser diode has a divergence angle selected from the range of 5-44 degrees. In an embodiment, the diodes have a configuration (e.g., emission area, divergence angle, output power, etc.) to provide a total brightness more than or equal to about $6.4 \times 10^8$ W/(m$^2$.sr).

Figure 2:
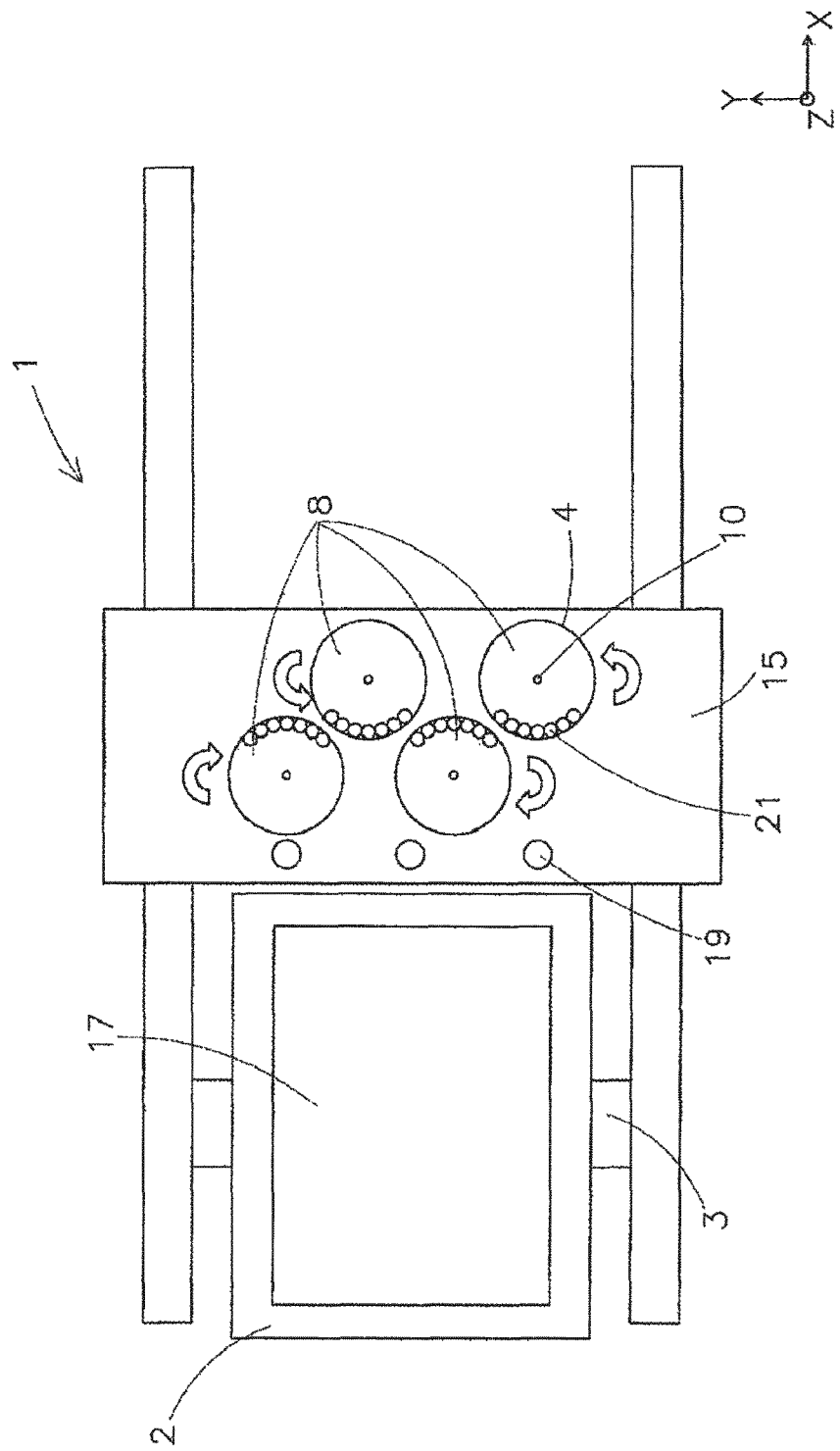
FIG. 2 depicts a top view of a part of the lithographic or exposure apparatus of FIG. 1 according to an embodiment of the invention.

The self-emissive contrast devices 4 are arranged on a frame 5 and may extend along the Y-direction and/or the X direction. While one frame 5 is shown, the apparatus may have a plurality of frames 5 as shown in FIG. 2. Further arranged on the frame 5 is lens 12. Frame 5 and thus self-emissive contrast device 4 and lens 12 are substantially stationary in the X-Y plane. Frame 5, self-emissive contrast device 4 and lens 12 may be moved in the Z-direction by actuator 7. Alternatively or additionally, lens 12 may be moved in the Z-direction by an actuator related to this particular lens. Optionally, each lens 12 may be provided with an actuator.

The self-emissive contrast device 4 may be configured to emit a beam and the projection system 12, 14 and 18 may be configured to project the beam onto a target portion of the substrate. The self-emissive contrast device 4 and the projection system form an optical column. The apparatus 1 may comprise an actuator (e.g. motor) 11 to move the optical column or a part thereof with respect to the substrate. Frame 8 with arranged thereon field lens 14 and imaging lens 18 may be rotatable with the actuator. A combination of field lens 14 and imaging lens 18 forms movable optics 9. In use, the frame 8 rotates about its own axis 10, for example, in the directions shown by the arrows in FIG. 2. The frame 8 is rotated about the axis 10 using an actuator (e.g. motor) 11. Further, the frame 8 may be moved in a Z direction by motor 7 so that the movable optics 9 may be displaced relative to the substrate table 2.

An aperture structure 13 having an aperture therein may be located above lens 12 between the lens 12 and the self-emissive contrast device 4. The aperture structure 13 can limit diffraction effects of the lens 12, the associated self-emissive contrast device 4, and/or of an adjacent lens 12/self-emissive contrast device 4.

The depicted apparatus may be used by rotating the frame 8 and simultaneously moving the substrate on the substrate table 2 underneath the optical column. The self-emissive contrast device 4 can emit a beam through the lenses 12, 14, and 18 when the lenses are substantially aligned with each other. By moving the lenses 14 and 18, the image of the beam on the substrate is scanned over a portion of the substrate. By simultaneously moving the substrate on the substrate table 2 underneath the optical column, the portion of the substrate which is subjected to an image of the self-emissive contrast device 4 is also moving. By switching the self-emissive contrast device 4 "on" and "off" (e.g., having no output or output below a threshold when it is "off" and having an output above a threshold when it is "on") at high speed under control of a controller, controlling the rotation of the optical column or part thereof, controlling the intensity of the self-emissive contrast device 4, and controlling the speed of the substrate, a desired pattern can be imaged in the resist layer on the substrate.

FIG. 2 depicts a schematic top view of the apparatus of FIG. 1 having self-emissive contrast devices 4. Like the apparatus 1 shown in FIG. 1, the apparatus 1 comprises a substrate table 2 to hold a substrate 17, a positioning device 3 to move the substrate table 2 in up to 6 degrees of freedom, an alignment/level sensor 19 to determine alignment between the self-emissive contrast device 4 and the substrate 17, and to determine whether the substrate 17 is at level with respect to the projection of the self-emissive contrast device 4. As depicted the substrate 17 has a rectangular shape, however also or alternatively round substrates may be processed.

The self-emissive contrast device 4 is arranged on a frame 15. The self-emissive contrast device 4 may be a radiation emitting diode, e.g., a laser diode, for instance a blue-violet laser diode. As shown in FIG. 2, the self-emissive contrast devices 4 may be arranged into an array 21 extending in the X-Y plane.

The array 21 may be an elongate line. In an embodiment, the array 21 may be a single dimensional array of self-emissive contrast devices 4. In an embodiment, the array 21 may be a two dimensional array of self-emissive contrast device 4.

A rotating frame 8 may be provided which may be rotating in a direction depicted by the arrow. The rotating frame may be provided with lenses 14, 18 (show in FIG. 1) to provide an image of each of the self-emissive contrast devices 4. The apparatus may be provided with an actuator to rotate the optical column comprising the frame 8 and the lenses 14, 18 with respect to the substrate.

Figure 3:
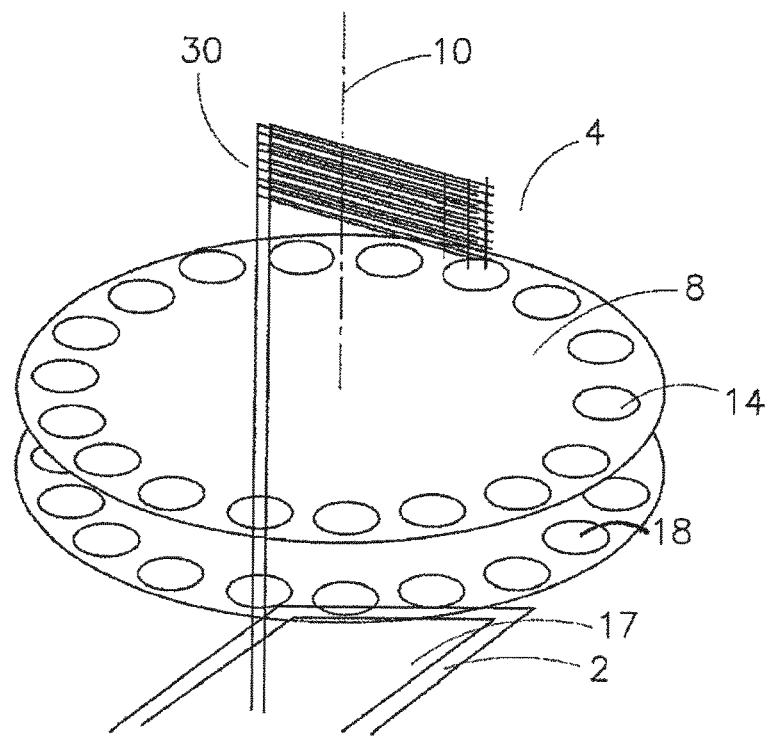
FIG. 3 depicts a highly schematic, perspective view of a part of a lithographic or exposure apparatus according to an embodiment of the invention.

FIG. 3 depicts a highly schematic, perspective view of the rotating frame 8 provided with lenses 14, 18 at its perimeter. A plurality of beams, in this example 10 beams, are incident onto one of the lenses and projected onto a target portion of the substrate 17 held by the substrate table 2. In an embodiment, the plurality of beams are arranged in a straight line. The rotatable frame is rotatable about axis 10 by means of an actuator (not shown). As a result of the rotation of the rotatable frame 8, the beams will be incident on successive lenses 14, 18 (field lens 14 and imaging lens 18) and will, incident on each successive lens, be deflected thereby so as to travel along a part of the surface of the substrate 17, as will be explained in more detail with reference to FIG. 4. In an embodiment, each beam is generated by a respective source, i.e. a self-emissive contrast device, e.g. a laser diode (not shown in FIG. 3). In the arrangement depicted in FIG. 3, the beams are deflected and brought together by a segmented mirror 30 in order to reduce a distance between the beams, to thereby enable a larger number of beams to be projected through the same lens and to achieve resolution requirements to be discussed below.

Figure 4:
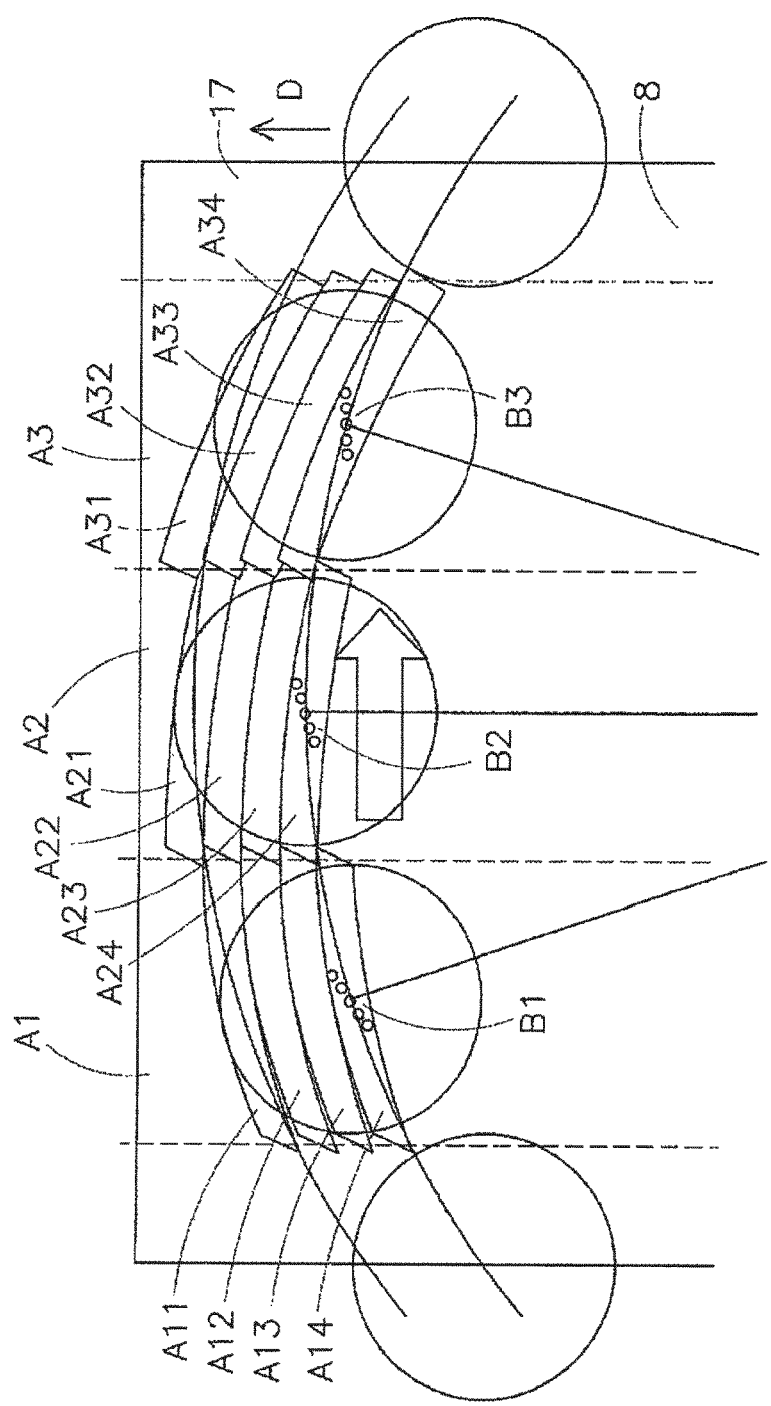
FIG. 4 depicts a schematic top view of projections by the lithographic or exposure apparatus according to FIG. 3 onto a substrate according to an embodiment of the invention.

As the rotatable frame rotates, the beams are incident on successive lenses and, each time a lens is irradiated by the beams, the places where the beam is incident on a surface of the lens, moves. Since the beams are projected on the substrate differently (with e.g. a different deflection) depending on the place of incidence of the beams on the lens, the beams (when reaching the substrate) will make a scanning movement with each passage of a following lens. This principle is further explained with reference to FIG. 4. FIG. 4 depicts a highly schematic top view of a part of the rotatable frame 8. A first set of beams is denoted by B1, a second set of beams is denoted by B2 and a third set of beams is denoted by B3. Each set of beams is projected through a respective lens set 14, 18 of the rotatable frame 8. As the rotatable frame 8 rotates, the beams B1 are projected onto the substrate 17 in a scanning movement, thereby scanning area A14. Similarly, beams B2 scan area A24 and beams B3 scan area A34. At the same time of the rotation of the rotatable frame 8 by a corresponding actuator, the substrate 17 and substrate table are moved in the direction D, which may be along the X axis as depicted in FIG. 2), thereby being substantially perpendicular to the scanning direction of the beams in the area's A14, A24, A34. As a result of the movement in direction D by a second actuator (e.g. a movement of the substrate table by a corresponding substrate table motor), successive scans of the beams when being projected by successive lenses of the rotatable frame 8, are projected so as to substantially abut each other, resulting in substantially abutting areas A11, A12, A13, A14 (areas A11, A12, A13 being previously scanned and A14 being currently scanned as shown in FIG. 4) for each successive scan of beams B1, areas A21, A22, A23 and A24 (areas A21, A22, A23 being previously scanned and A24 being currently scanned as shown in FIG. 4) for beams B2 and areas A31, A32, A33 and A34 (areas A31, A32, A33 being previously scanned and A34 being currently scanned as shown in FIG. 4) for beams B3. Thereby, the areas A1, A2 and A3 of the substrate surface may be covered with a movement of the substrate in the direction D while rotating the rotatable frame 8. The projecting of multiple beams through a same lens allows processing of a whole substrate in a shorter timeframe (at a same rotating speed of the rotatable frame 8), since for each passing of a lens, a plurality of beams scan the substrate with each lens, thereby allowing increased displacement in the direction D for successive scans. Viewed differently, for a given processing time, the rotating speed of the rotatable frame may be reduced when multiple beams are projected onto the substrate via a same lens, thereby possibly reducing effects such as deformation of the rotatable frame, wear, vibrations, turbulence, etc. due to high rotating speed. In an embodiment, the plurality of beams are arranged at an angle to the tangent of the rotation of the lenses 14, 18 as shown in FIG. 4. In an embodiment, the plurality of beams are arranged such that each beam overlaps or abuts a scanning path of an adjacent beam.

A further effect of the aspect that multiple beams are projected at a time by the same lens, may be found in relaxation of tolerances. Due to tolerances of the lenses (positioning, optical projection, etc), positions of successive areas A11, A12, A13, A14 (and/or of areas A21, A22, A23 and A24 and/or of areas A31, A32, A33 and A34) may show some degree of positioning inaccuracy in respect of each other. Therefore, some degree of overlap between successive areas A11, A12, A13, A14 may be required. In case of for example 10% of one beam as overlap, a processing speed would thereby be reduced by a same factor of 10% in case of a single beam at a time through a same lens. In a situation where there are 5 or more beams projected through a same lens at a time, the same overlap of 10% (similarly referring to one beam example above) would be provided for every 5 or more projected lines, hence reducing a total overlap by a factor of approximately 5 or more to 2% or less, thereby having a significantly lower effect on overall processing speed. Similarly, projecting at least 10 beams may reduce a total overlap by approximately a factor of 10. Thus, effects of tolerances on processing time of a substrate may be reduced by the feature that multiple beams are projected at a time by the same lens. In addition or alternatively, more overlap (hence a larger tolerance band) may be allowed, as the effects thereof on processing are low given that multiple beams are projected at a time by the same lens.

Alternatively or in addition to projecting multiple beams via a same lens at a time, interlacing techniques could be used, which however may require a comparably more stringent matching between the lenses. Thus, the at least two beams projected onto the substrate at a time via the same one of the lenses have a mutual spacing, and the apparatus may be arranged to operate the second actuator so as to move the substrate with respect to the optical column to have a following projection of the beam to be projected in the spacing.

In order to reduce a distance between successive beams in a group in the direction D (thereby e.g. achieving a higher resolution in the direction D), the beams may be arranged diagonally in respect of each other, in respect of the direction D. The spacing may be further reduced by providing a segmented mirror 30 in the optical path, each segment to reflect a respective one of the beams, the segments being arranged so as to reduce a spacing between the beams as reflected by the mirrors in respect of a spacing between the beams as incident on the mirrors. Such effect may also be achieved by a plurality of optical fibers, each of the beams being incident on a respective one of the fibers, the fibers being arranged so as to reduce along an optical path a spacing between the beams downstream of the optical fibers in respect of a spacing between the beams upstream of the optical fibers.

Further, such effect may be achieved using an integrated optical waveguide circuit having a plurality of inputs, each for receiving a respective one of the beams. The integrated optical waveguide circuit is arranged so as to reduce along an optical path a spacing between the beams downstream of the integrated optical waveguide circuit in respect of a spacing between the beams upstream of the integrated optical waveguide circuit.

A system may be provided for controlling the focus of an image projected onto a substrate. The arrangement may be provided to adjust the focus of the image projected by part or all of an optical column in an arrangement as discussed above.

In an embodiment the projection system projects the at least one radiation beam onto a substrate formed from a layer of material above the substrate 17 on which a device is to be formed so as to cause local deposition of droplets of the material (e.g. metal) by a laser induced material transfer.

Figure 5:
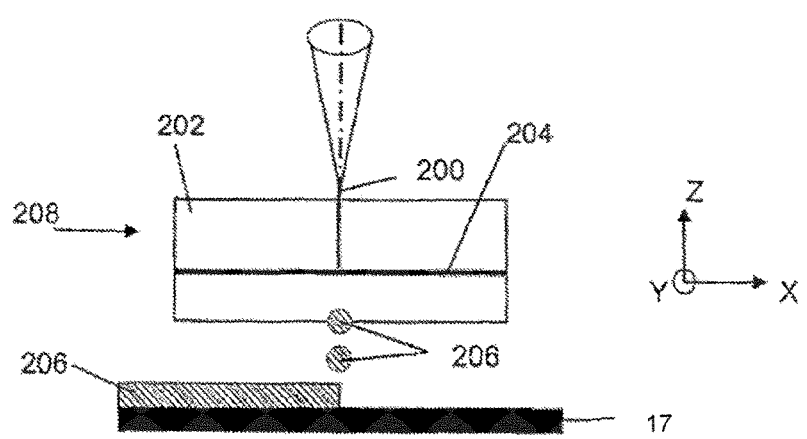
FIG. 5 depicts in cross-section, a part of an embodiment of the invention.

Referring to FIG. 5, the physical mechanism of laser induced material transfer is depicted. In an embodiment, a radiation beam 200 is focused through a substantially transparent material 202 (e.g., glass) at an intensity below the plasma breakdown of the material 202. Surface heat absorption occurs on a substrate formed from a donor material layer 204 (e.g., a metal film) overlying the material 202. The heat absorption causes melting of the donor material 204. Further, the heating causes an induced pressure gradient in a forward direction leading to forward acceleration of a donor material droplet 206 from the donor material layer 204 and thus from the donor structure (e.g., plate) 208. Thus, the donor material droplet 206 is released from the donor material layer 204 and is moved (with or without the aid of gravity) toward and onto the substrate 17 on which a device is to be formed. By pointing the beam 200 on the appropriate position on the donor plate 208, a donor material pattern can be deposited on the substrate 17. In an embodiment, the beam is focused on the donor material layer 204.

In an embodiment, one or more short pulses are used to cause the transfer of the donor material. In an embodiment, the pulses may be a few picoseconds or femto-seconds long to obtain quasi one dimensional forward heat and mass transfer of molten material. Such short pulses facilitate little to no lateral heat flow in the material layer 204 and thus little or no thermal load on the donor structure 208. The short pulses enable rapid melting and forward acceleration of the material (e.g., vaporized material, such as metal, would lose its forward directionality leading to a splattering deposition). The short pulses enable heating of the material to just above the heating temperature but below the vaporization temperature. For example, for aluminum, a temperature of about 900 to 1000 degrees Celsius is desirable.

In an embodiment, through the use of a laser pulse, an amount of material (e.g., metal) is transferred from the donor structure 208 to the substrate 17 in the form of 100-1000 nm droplets. In an embodiment, the donor material comprises or consists essentially of a metal. In an embodiment, the metal is aluminum. In an embodiment, the material layer 204 is in the form a film. In an embodiment, the film is attached to another body or layer. As discussed above, the body or layer may be a glass.

Figure 6:
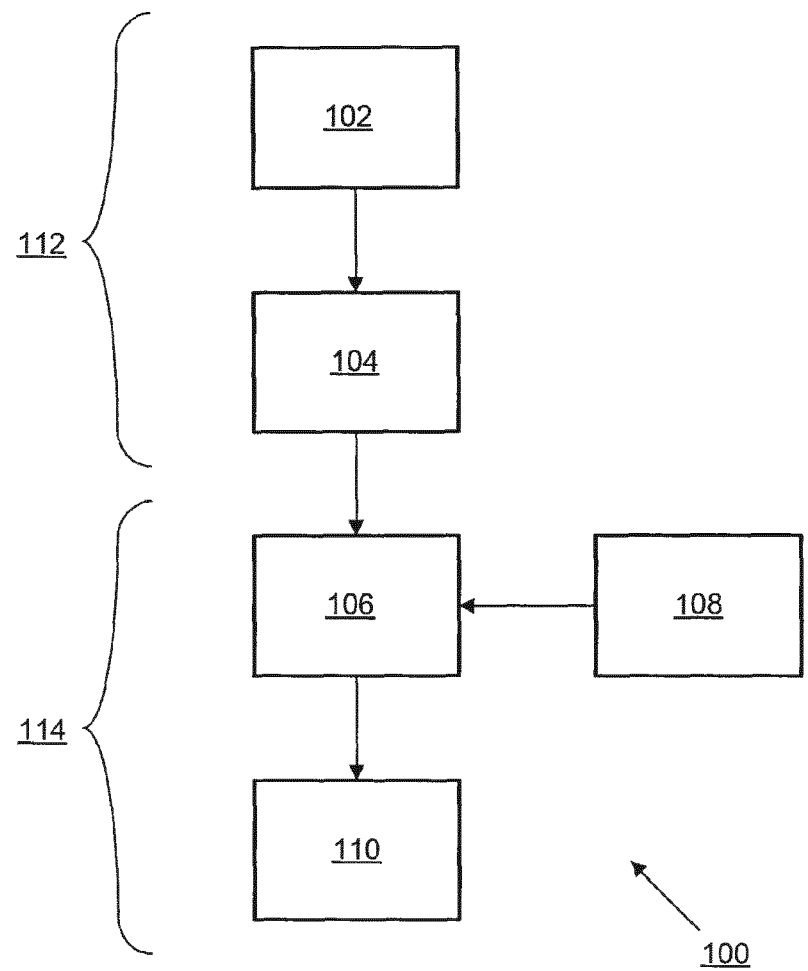
FIG. 6 depicts a portion of a data-path to convert a vector-based representation of a desired device pattern to a control signal.

Hardware and/or software constituting a data processing system 100, which may also be referred to as a "data-path", may be provided to convert a vector-based representation of a desired device pattern to be formed on a substrate to a control signal suitable for driving a programmable patterning device in such a way that a dose pattern of radiation that is suitable for forming the desired device pattern is applied to a target (e.g., the substrate). FIG. 6 is a schematic illustration showing example processing stages 100 that may be included in such a data-path. In an embodiment each of the stages is connected directly to its neighboring stages. However, this need not be the case. In an embodiment one or more additional processing stages may be provided in between any of the stages shown. Additionally or alternatively, each of one or more of the stages may comprise multiple stages. One or more of the stages may be combined. In an embodiment, the stages are implemented using a single physical processing unit (e.g. a computer or hardware that can carry out computing operations) or different processing units.

In the example shown in FIG. 6 a vector-based representation of a desired device pattern is provided in storage stage 102. In an embodiment, the vector-based representation is constructed using a vector design package, such as GDSII. The vector-based representation is forwarded to a rasterization stage 104, either directly or via one or more intermediate stages, from the storage stage 102. Examples of intermediate stages include a vector pre-processing stage and a low-pass filter stage. In an embodiment, the low-pass filter stage performs anti-aliasing processing for example.

The rasterization stage 104 converts the vector-based representation (or a processed version of the vector-based representation) of the desired device pattern to a rasterized representation of a desired dose pattern that corresponds to the desired device pattern (i.e. is suitable for forming the desired device pattern by post-exposure processing of the substrate). In an embodiment, the rasterized representation comprises bitmap data. The bitmap data may be referred to as "pixelmap" data. In an embodiment, the bitmap data comprises a set of values indicating the desired dose at each point on a grid of points. The grid of points may be referred to as a rasterization grid.

In an embodiment, the rasterized representation (as output from the rasterization stage 104 directly or after further processing) is supplied to a control signal generation stage 106. The control signal generation stage 106 may be implemented as a single stage (as shown) or as a plurality of separate stages.

In an embodiment, the control signal generation stage 106 performs a mapping operation between the rasterization grid and the grid (which may be referred to as the "spot exposure grid") defining the locations at which the patterning device can form spot exposures at the target (e.g., substrate) level. Each spot exposure comprises a dose distribution. The dose distribution specifies how the energy per unit area applied by the spot to the substrate (i.e. dose per unit area) varies as a function of position within the spot. The dose distribution may be referred to as a "point spread function". In an embodiment, the position of the spot exposure is defined by reference to a characteristic point in the dose distribution. In an embodiment, the characteristic point is the position of maximum dose per unit area. In an embodiment, the position of maximum dose per unit area is in a central region of the spot. In other embodiments, the position of maximum dose per unit area is not in a central region of the spot. In an embodiment, the dose distribution is circularly symmetric. In such an embodiment, the spot may be referred to as a circular spot. In such an embodiment, the position of maximum dose per unit area may be located at the center of the circle. In other embodiments, the dose distribution is not circular. In an embodiment, the characteristic point in the dose distribution is the "center of mass" of the dose distribution (defined by direct analogy with the center of mass of a flat object having variable density, in which the dose per unit area of the spot exposure is the equivalent of the mass per unit area of the flat object). The "center of mass" of the dose distribution therefore represents the average location of the dose. In an embodiment, each grid point in the spot exposure grid represents the position of a different one of the spot exposures (e.g. the position of the characteristic point) that the patterning device (and/or projection system) can apply to the substrate.

In an embodiment, the lithography or exposure apparatus is configured to produce spot exposures that consist of discrete "spots" (e.g. circular spots). In an example of such an embodiment, the intensity of a given radiation beam at the level of the target reaches zero at times in between the exposure of different spots by that radiation beam. In an embodiment, the lithography or exposure apparatus is configured to produce spot exposures in continuous lines. The continuous lines may be considered as a sequence of spot exposures in which the intensity of a given radiation beam at the level of the substrate does not reach zero in between exposure of different spots in the sequence by that radiation beam. An example embodiment of this type is described above with reference to FIG. 4.

In an embodiment, each spot exposure corresponds to a region of radiation dose on the target that originates from a single self-emissive contrast device during a single period of that contrast device being driven at a constant power, for example. In an embodiment, the mapping operation comprises interpolation between the rasterization grid and the spot exposure grid. In an embodiment, the mapping operation is configured to receive metrology data from a metrology data storage stage 108. In an embodiment, the metrology data specifies, for example, the position and/or orientation of the mounted substrate, and/or of a previously formed device pattern on the mounted substrate, relative to the patterning device. In an embodiment, the metrology data also specifies measured distortions of a mounted substrate or previously formed device pattern. In an embodiment, the distortions include one or more of the following: shift, rotation, skew and/or magnification, for example. The metrology data therefore provides information about how the interpolation between the rasterization grid and the spot exposure grid should be carried out in order to ensure proper positioning of the desired dose pattern on the target.

The control signal generation stage 106 may calculate a set of "intensities", "energies" and/or "doses" to be applied at each position in the spot exposure grid to form the desired dose pattern. In the present application where reference is made to "intensities", it is understood to encompass intensities, energies and/or doses. In an embodiment, the set of intensities define, for each position in the grid, the power of the radiation beam that is to be used to generate the spot that is centered at that position, for example. In an embodiment, the power of the radiation beam is determined by the size of the voltage or current that is applied to the self-emissive contrast device that is to generate the radiation beam, for example. This calculation may account for the properties of the optical projection system and may therefore be referred to as an "inverse-optics" calculation. In an embodiment, the calculation accounts for the sizes and/or shapes of individual spots. In an embodiment, the sizes and/or shapes of individual spots are at least partially dictated by one or more properties of the optical projection system. In an embodiment, the size and/or shape is defined for each of a given set of possible applied intensities for the spot. In an embodiment, the spot size and/or shape defines the variation with position of the applied dose for a given spot, for example. In an embodiment, the calculation also takes into account deviations in the positions of the spots from nominal positions defined by the ideal (i.e. engineering-error free) spot exposure grid geometry.

In an embodiment, the programmable patterning device is configured to produce a plurality of radiation beams having individually controllable exposure times. Each exposure time corresponds to the period of time for which the radiation corresponding to a given spot exposure is applied. In an example of such an embodiment, the control signal generation stage 106 calculates a set of target exposure times. In an embodiment, the exposure times are controlled using a shutter element or matrix of shutter elements positioned between a radiation source(s) (e.g. one or more self-emissive contrast elements) and the target. In an example of such an embodiment, the radiation source(s) may be configured to remain "on" between exposures of different spots. The exposure times are determined by the length of time for which the relevant part of the shutter element or matrix of shutter elements is "open". Alternatively or additionally, the exposure times are controlled by controlling a driving duration of the radiation source(s) (e.g. one or more self-emissive contrast elements).

In an embodiment, the programmable patterning device is configured to produce a plurality of radiation beams having individually controllable intensities and individually controllable exposures times. In an example of such an embodiment, the control signal generation stage 106 calculates combinations of target intensity values and target exposure times that are suitable to achieve a desired dose pattern.

In an embodiment the spots overlap with each other at target (e.g., substrate) level so that the final dose achieved at a reference position in the spot exposure grid depends on the applied intensities at a number of neighboring spots. This effect can be described (handled/modeled) mathematically by a convolution (or deconvolution) operation. In an embodiment the control signal generation stage 106 performs the reverse process to determine the intensities to be applied at each position for a given desired dose pattern. Therefore, in such an embodiment the control signal generation stage 106 performs a deconvolution (or convolution) operation. This operation is referred to below as a (de-)convolution operation. In an embodiment the (de-) convolution operation is defined by a (de-)convolution kernel. In an embodiment the (de-)convolution kernel is represented by a (de-)convolution matrix. In an embodiment the coefficients of such a (de-)convolution matrix are interpreted as weights that define the extent to which the dose at points in the region of a reference point in the desired dose pattern need to be taken into account when calculating the intensity to be applied at the corresponding point (or spot) in the spot exposure grid.

Figure 7:
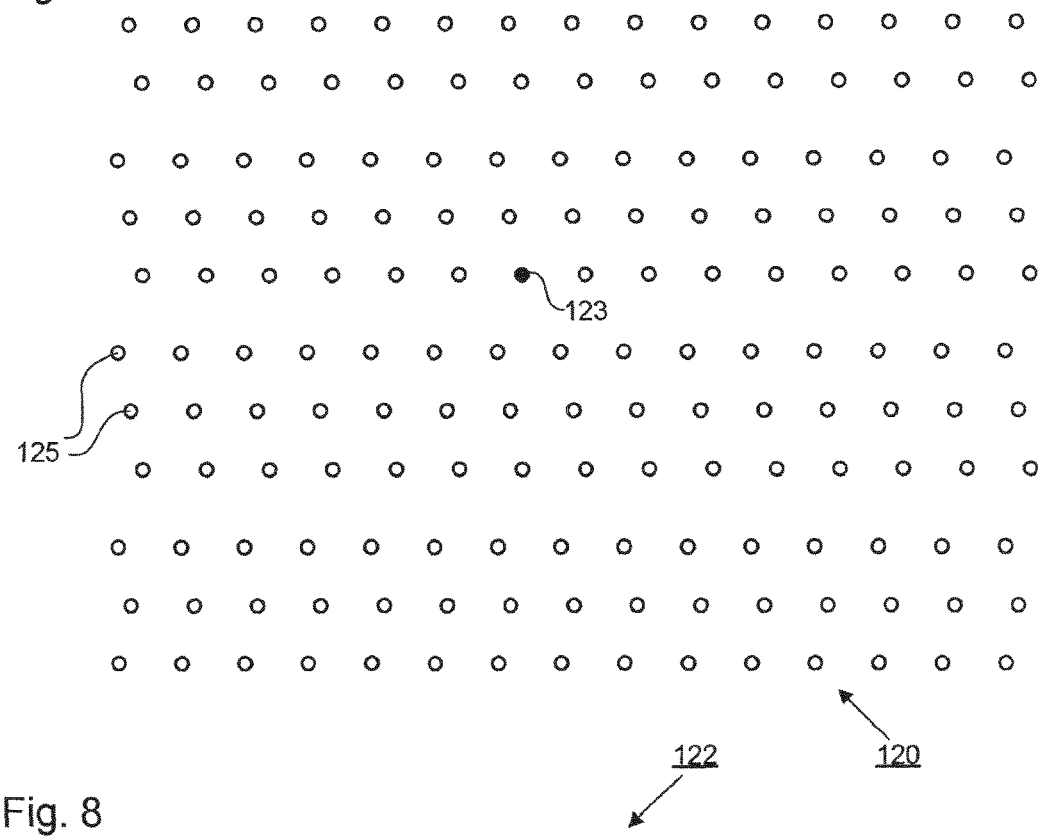
FIG. 7 depicts a portion of a spot exposure grid.
Figure 8:
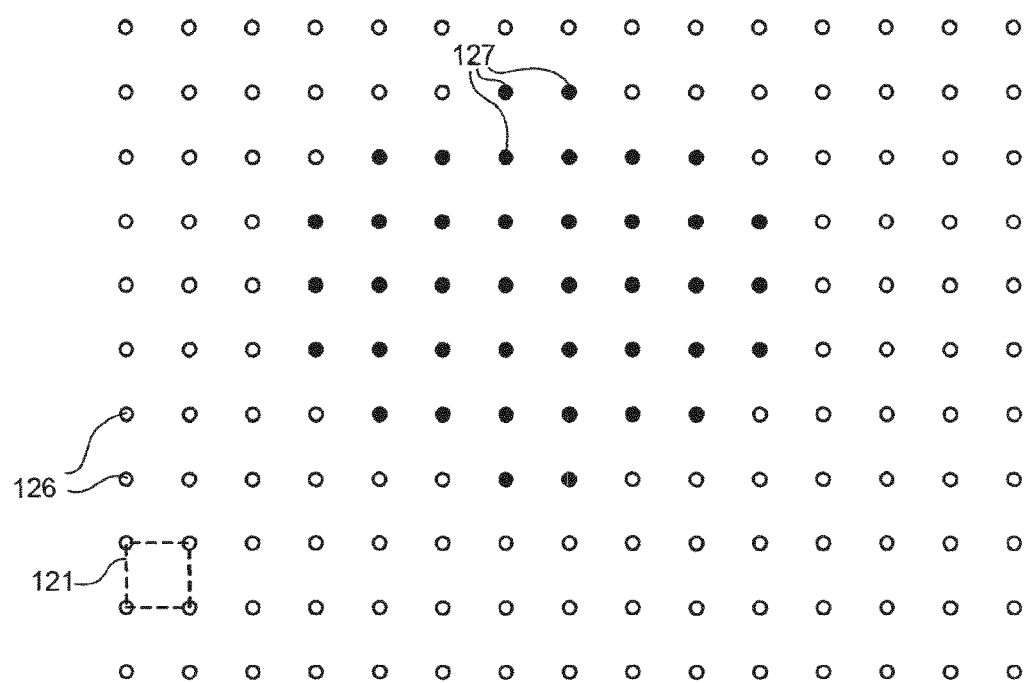
FIG. 8 depicts a portion of a rasterization grid.

FIGS. 7 and 8 illustrate highly schematically a step in such a (de-)convolution operation.

FIG. 7 illustrates a portion of a highly schematic example spot exposure grid 120. Each point 125 in the grid 120 represents the center of a spot that will be formed by the patterning device on the target. The (de-)convolution operation aims to determine the intensity value to apply at each of the points 125. The spot exposure grid 120 will have a geometry that corresponds to the pattern of spot exposures that the patterning device is able to form on the target. In an embodiment, the geometry of the spot exposure grid is therefore irregular. In an irregular grid, within the meaning of the present application, the density of grid points varies as a function of position so that it is not possible to construct the grid completely by tessellating a single unit cell that contains a single grid point only. The geometry of the grid 120 that is illustrated in FIG. 7 is highly schematic and does not necessarily resemble a spot exposure grid associated with a commercial device.

FIG. 8 illustrates an example portion of a highly schematic example rasterization grid 122. In this example the rasterization grid 122 has a regular geometry. In this example the regular geometry is rectangular. The density of grid points of a regular grid, within the meaning of the present application, is "uniform" in the sense that the grid can be completely formed by tessellating a single type of unit cell that comprises a single grid point only. Dotted line 121 illustrates an example unit cell. The dotted line intersects a quarter of four grid points and therefore contains one grid point in total. In an embodiment a sample of the desired dose pattern may be provided at each of the points 126 in the grid 122.

The solid grid point 123 in FIG. 7 represents a reference grid point (chosen at random). Application of the (de-)convolution operation for deriving the intensity to be applied at the solid grid point 123 will involve weighted contributions of the samples of the desired dose pattern at a plurality of grid points in the spot exposure grid in the region of the spot exposure grid corresponding to the position of the reference grid point 123. The solid grid points 127 in FIG. 8 represent schematically the grid points that are involved with such a (de-)convolution operation. In an embodiment, a (de-) convolution kernel expressed as a matrix will define which grid points 126 are involved (by the positions of the non-zero coefficients in the matrix) and the extent to which the grid points are involved (by the values of the non-zero coefficients in the matrix).

In an embodiment, the nature of the (de-)convolution operation is different for different points (or even in between different points) in the spot exposure grid. In an embodiment, such variation takes into account variations in the optical performance of the patterning device for example. In an embodiment the variations in optical performance are obtained using calibration measurements. In an embodiment a library of (de-)convolution kernels, optionally obtained from calibration measurements, is stored and accessed as needed.

In an embodiment, the control signal generation stage 106 converts the sequence of intensity values to be applied at each of the points in the spot exposure grid to setpoint values in order to generate the control signal. In an embodiment the setpoint values take into account the nature of the patterning device. For example, where the patterning device comprises a plurality of self-emissive contrast devices, the setpoint values in such an embodiment account for non-linearity in the response of the self-emissive contrast devices (e.g. non-linearity in the variation of output power as a function of applied setpoint/voltage/current). In an embodiment the setpoint values take into account variations in the properties of nominally identical contrast devices, by calibration measurements for example.

A control signal output stage 110 receives the control signal from the control signal generation stage and supplies the signal to the patterning device.

In the example shown in FIG. 6, stages 102 and 104 operate in an offline part 112 of the data-path and stages 106-110 operate in an online (i.e. realtime) part 114 of the data-path. However, this is not essential. In an embodiment all or a portion of the functionality associated with stage 104 are carried out online. Alternatively or additionally, all or a portion of the functionality of stages 106 and/or 108 are carried out offline.

Figure 9:
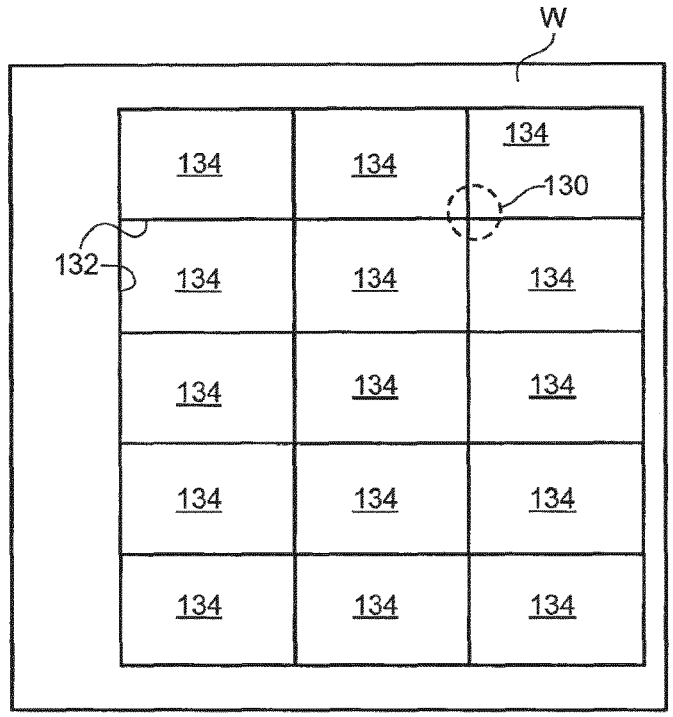
FIG. 9 depicts an example device layout.
Figure 10:
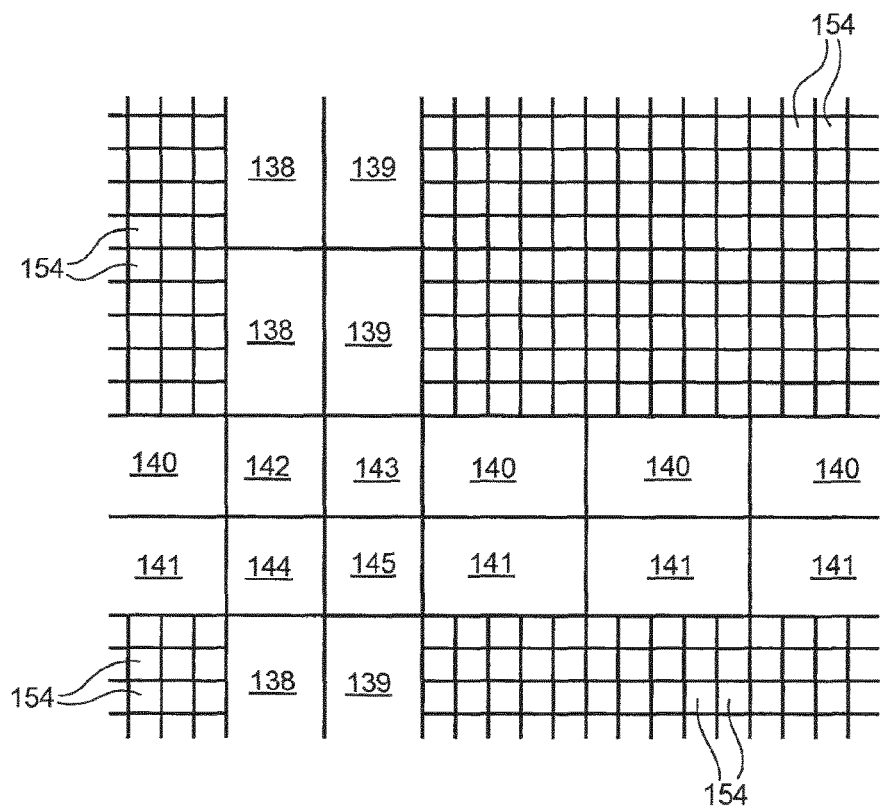
FIG. 10 is a magnified view of a region of the layout shown in FIG. 9.

FIG. 9 illustrates an example device layout on a substrate W. The device layout may be for a flat panel display or a portion thereof, for example. The layout comprises a plurality of rectangular areas 134 comprising arrays of pixels 154 (shown in FIG. 10) surrounded by border regions 132. FIG. 10 depicts a close up view of the corner region 130 of one of the rectangular areas.

The device layout illustrated contains a large amount of repetition. The device pattern necessary for defining each of the pixels 154 is identical. Similarly, each of the device patterns necessary for defining sections 138-145 of the border regions 132 is identical. There may also be a significant degree of repetition within each of the pixels 154 and/or within each of one or more of the sections 138-145.

In an embodiment, repetition within the desired device pattern is exploited by using a hierarchy in the vector-based representation. In an embodiment a library of primitive patterns is provided and the vector-based representation describes a device pattern by specifying where instances of these primitive patterns are located in the pattern (e.g. by specifying their location and orientation).

Figure 11:
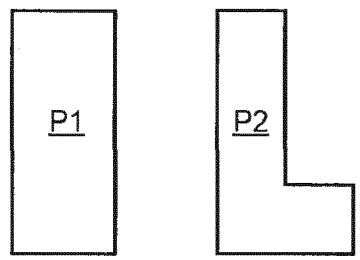
FIG. 11 depicts two example primitive patterns.
Figure 12:
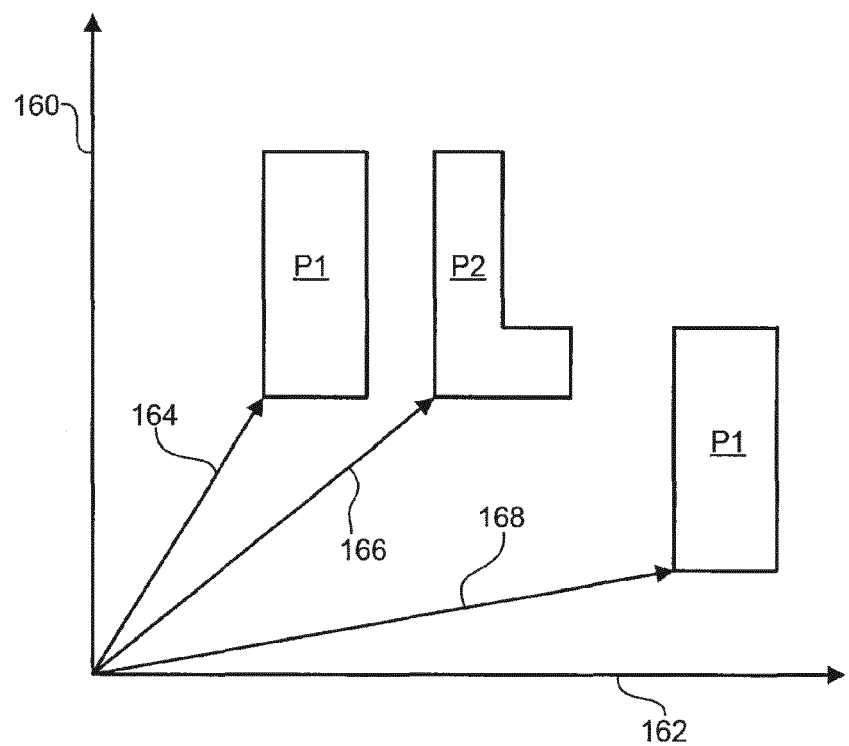
FIG. 12 depicts a portion of a device pattern comprising instances of the primitives of FIG. 11.

FIG. 11 depicts two example primitives, P1 and P2. FIG. 12 illustrates a portion of a target device pattern that is built up from two P1 primitives and one P2 primitive. Axes 160 and 162 represent axes (e.g. X and Y) in a coordinate system of the vector-based representation. The arrows 164, 166 and 168 illustrate vectors that specify the positions of the three primitives in the pattern. The vector-based representation defining this pattern comprises definitions of each of the two primitives P1 and P2 that are used (which may be referred to as "primitive data") and the vectors 164, 166, 168 (which may be referred to as "instance data"). In this example the instance data comprises position information only (via vectors 164, 166 and 168). However in an embodiment, other information, such as orientation information, is provided. The primitive P1 only has to be defined once despite the fact that there are a plurality of instances of the primitive P1. Where there are a large number of instances of any given primitive there will therefore be a large reduction in the data volume compared with representations that define each primitive separately regardless of repetition (i.e. a system without hierarchy).

The data-path processing converts the vector-based representation into a rasterized representation as a step to forming a control signal for the patterning device. However, rasterization processes typically involve the generation of bitmap files which do not keep any hierarchy. If a feature is repeated, all of the bitmap values that define that feature will also tend to be repeated. The output of the rasterization process therefore tends to be very much larger than the vector-based representation. For example, for a vector-based representation of a typical pattern defined on a 100 nm grid, a typical data size would be about 100 MByte. A fully decompressed rasterized representation (i.e. a representation without hierarchy) of such a pattern might be about 100 TByte.

Large data volumes are difficult to handle efficiently in the data-path, increasing expense and/or inhibiting performance.

According to an embodiment, the performance of the data-path is improved by delaying full decompression of the desired dose pattern data until later in the data-path. This is achieved by converting the vector-based representation of the desired device pattern into a rasterized representation that maintains a degree of hierarchy (and therefore compression). The rasterized representation maintaining a degree of hierarchy may be referred to as a hierarchical rasterized representation.

In an embodiment, the hierarchical rasterized representation is generated as follows. Rasterized versions of each of the primitive patterns that are used in the vector-based representation are generated. The rasterized versions may be referred to as "rasterized primitives". The rasterized primitives for a given desired device pattern are then stored along with instance data describing where each instance of each rasterized primitive is positioned in the pattern. In an embodiment, the rasterized primitives are generated each time a given vector-based representation is to be converted. Alternatively or additionally, a library of pre-rasterized primitives is formed. In an embodiment, such a library contains rasterized primitives corresponding to the primitives used in a given vector-based representation to be converted plus a number of other rasterized primitives that may be useful for converting other vector-based representations. In an embodiment, the library contains rasterized primitives for all of the primitives that may be used by a given type of vector-based representation. In an embodiment the library contains a rasterized primitive for each primitive that can be used in the GDSII format. The use of such a library may speed up the process of generating the hierarchical rasterized representation.

Figure 13:
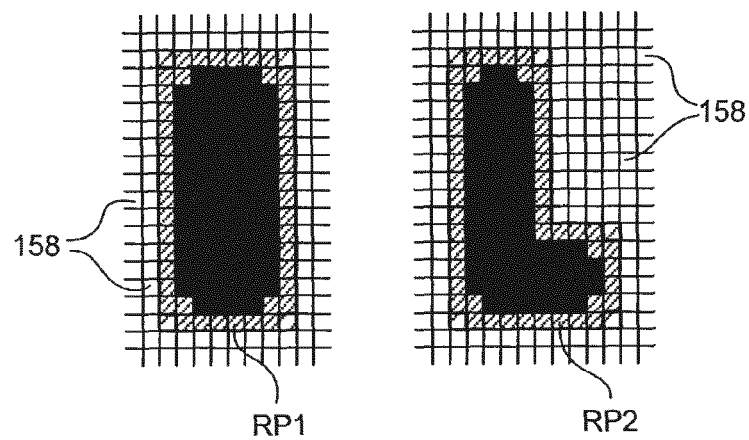
FIG. 13 depicts two rasterized primitives corresponding to the primitives depicted in FIG. 11.

FIG. 13 illustrates schematically how rasterized primitives RP1 and RP2 corresponding respectively to the primitives P1 and P2 shown in FIG. 11 are formed in an embodiment. In this embodiment, the rasterized primitives comprise a set of values representing the dose to be applied in each of a set of regions 158 of a rasterization grid.

Figure 14:
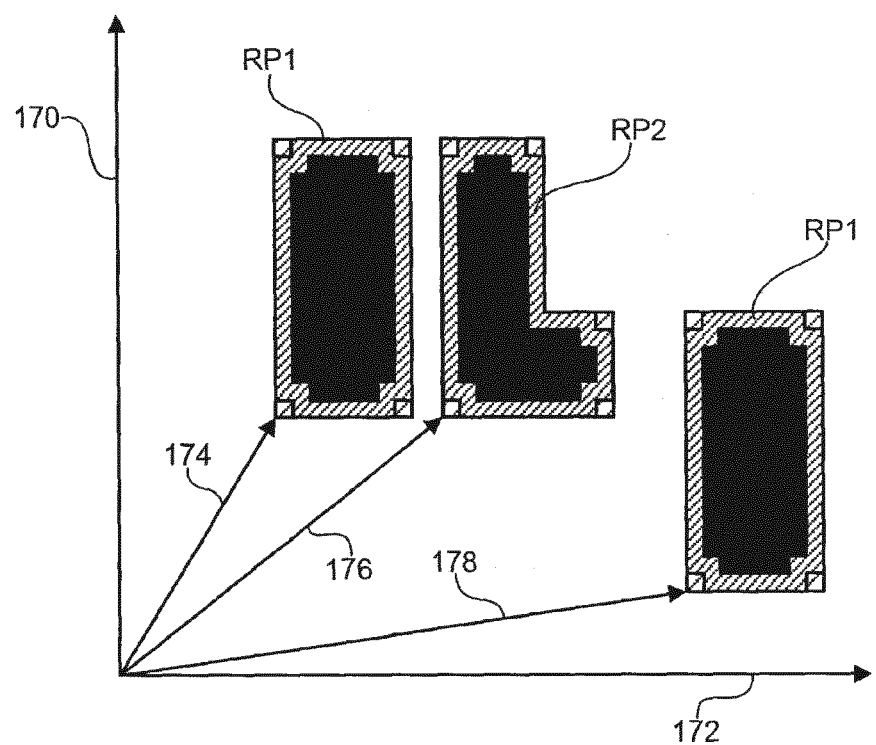
FIG. 14 depicts a portion of a rasterized representation comprising instances of the rasterized primitives shown in FIG. 13.

FIG. 14 illustrates how the instance data in an embodiment describe how the rasterized primitives RP1 and RP2 should be positioned. Axes 170 and 172 define the coordinate system. In this embodiment the instance data comprises vectors 174, 176 and 178, defined relative to the coordinate system, which specify the positions of the two instances of the RP1 rasterized primitive and the one instance of the RP2 rasterized primitive. In this example the instance data comprises position information only (via vectors 174, 176 and 178). However in an embodiment, other information, such as orientation information, is provided.

The primitives (vector-based and/or rasterized) may take various forms. In an embodiment, the primitives comprise one or more of the following: a closed shape (e.g. circle), a polgyon (regular or irregular), intersecting lines forming a non-closed shape (e.g. a cross shape), a non-intersecting line (e.g. a single line, a plurality of lines, parallel lines, a line forming a corner or elbow). In an embodiment, the primitives comprise portions of the desired device pattern corresponding to particular device features. In an embodiment, at least one of the primitives comprises most or all of the pattern necessary to define a single flat panel display pixel. In an embodiment, at least one of the primitives comprises most or all of the pattern necessary to define a segment of the border region of a flat panel display. In an embodiment, the segment of the border region comprises a portion of a border region that is aligned substantially perpendicularly to a scanning direction of the substrate. In such an embodiment, the portion of the border region optionally includes all of the width of the border region substantially parallel to the scanning direction and a portion of the length of the border region substantially perpendicular to the scanning direction. In an embodiment, the segment of the border region comprises a portion of a border region that is aligned substantially parallel to a scanning direction. In such an embodiment, the portion of the border region optionally include all of the width of the border region substantially perpendicular to the scanning direction and a portion of the length of the border region substantially parallel to the scanning direction.

In an embodiment, one or more of the primitives forming the desired device pattern may overlap with each other.

In the example data-path processing sequence described above with reference to FIG. 6, the rasterization stage 104 is configured to operate offline. Where the rasterization stage produces a fully decompressed rasterized representation (i.e. without hierarchy), large capacity storage hardware is therefore used to store the output and transfer the output to the online part of the data-path.

In an embodiment, the rasterization stage 104 is configured to output a hierchical rasterized representation, as described above, instead of a fully decompressed rasterized representation. This approach reduces the volume of data stored and transferred and therefore saves cost and/or time.

In an embodiment, decompression of the hierarchical rasterized representation (i.e. removal of the hierarchy) is performed by the control signal generation section 106. In an embodiment, the decompression is performed online. In an embodiment, the decompression is performed as part of the mapping operation between the rasterization grid and the spot exposure grid for example. In an embodiment, the process of decompression is combined with the process of interpolating between the rasterization grid and the spot exposure grid. In an embodiment, at least a portion of the decompression and/or mapping and/or interpolation is carried out while the pattern is being formed in or on the substrate by the lithographic or exposure apparatus. In an embodiment, the decompression comprises, for each point in the rasterization grid, referring to the instance data and the rasterized primitive data to determine the desired dose value at the point.

Figure 15:
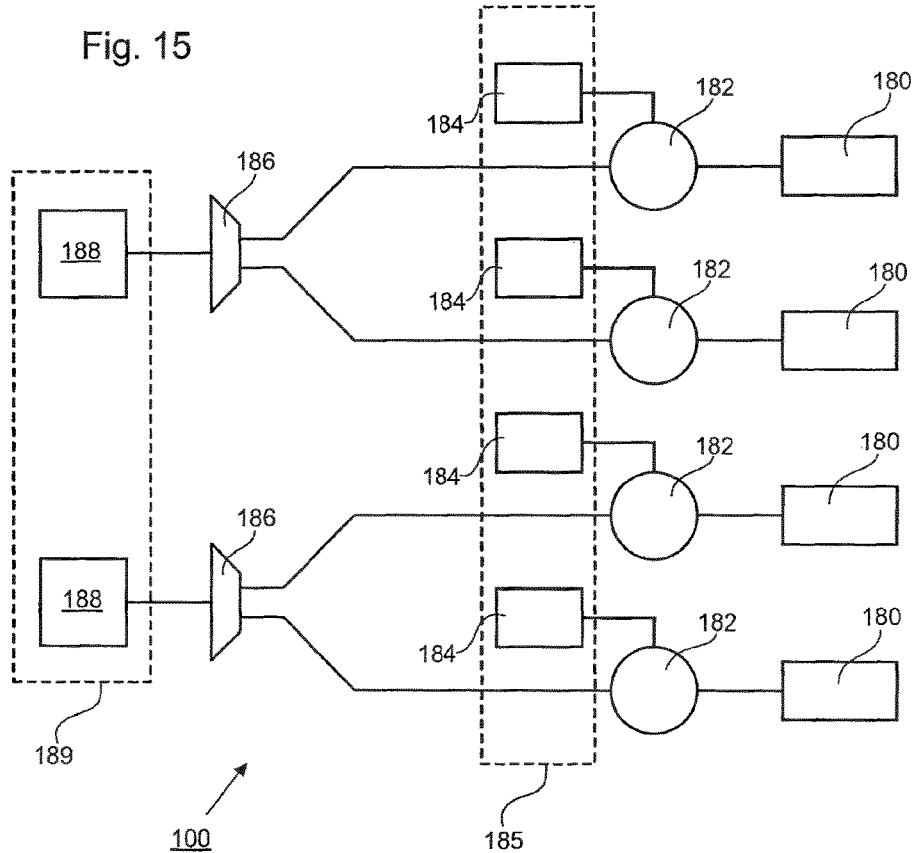
FIG. 15 depicts an example hardware configuration to implement a portion of the data-path.

FIG. 15 illustrates a portion of a data processing system 100 according to an embodiment. In this embodiment, setpoint data or data for use in deriving setpoint data, is output via output units 180. A plurality of the output units 180 are provided. Each output unit 180 corresponds to a portion of the area of the target (e.g., substrate) onto which the desired dose pattern is to be exposed. In an embodiment, each portion is a strip aligned substantially parallel to a direction of scanning of the substrate relative to the patterning device. In an embodiment, each portion corresponds to the region where spot exposures from a single, mechanically distinct patterning device or portion of the patterning device are received. In an embodiment, each of the strips is aligned with spot exposures from one, or a group of more than one, self-emissive contrast devices of a patterning device. In an embodiment, each of the strips is aligned with spot exposures from a lens 12 that is configured to receive radiation from a particular one, or group of more than one, self-emissive contrast devices and has a fixed spatial relationship with that one, or group of more than one, self-emissive contrast devices (e.g., the lens 12 is not configured to rotate on a frame 8 like lenses 14 and 18). In an embodiment, the strips overlap with each other in a direction substantially perpendicular to the scanning direction to help ensure continuity in the dose pattern formed.

Each of the output units 180 is connected to a processing unit 182 that is configured to calculate setpoint data (or data for use in deriving setpoint data) for the output unit 180 to which it is connected. In an embodiment, the calculations comprise one or more of the calculations described above in relation to the control signal generation stage 106. In an embodiment, the calculations include conversion of a rasterized representation of a portion of a desired dose pattern corresponding to the strip associated with the processing unit 182 to a sequence of setpoint data for producing the desired dose pattern. In an embodiment, where the processing unit is associated with a particular portion of the patterning device the setpoint data is configured to be suitable to control the one or more contrast devices associated with that portion of the patterning device.

In an embodiment, the data processing system 100 comprises a higher bandwidth memory section 185 and a lower bandwidth memory section 189 (the higher bandwidth memory section 185 having a bandwidth that is higher than the bandwidth of the lower bandwidth memory section). In an embodiment, the higher bandwidth memory section 185 comprises a plurality of separate local memories 184. In an embodiment, each of the local memories 184 is connected to one of the processing units 182. In an embodiment, the lower bandwidth section 189 comprises one or more shared memories 188. In an embodiment, each of the one or more shared memories 188 is selectively connectable to two or more of the processing units 182. In the example shown, each of the shared memories 188 is selectively connectable via a switch 186 to two processing units 182. In other embodiments, the shared memories are connectable to more than two processing units 182 and/or to processing units 182 that are not directly adjacent to each other (i.e. not neighboring).

In an embodiment, the data processing system 100 comprises a plurality of local memories 184 and no shared memory 188. In an embodiment, the data processing system 100 comprises a plurality of shared memories 188 and no local memory 184. In an embodiment, a single shared memory 188 is provided, with or without local memory 184.

The provision of separate memory sections having different bandwidths makes it possible to store the rasterized representation that is to be converted by the processing units 182 in a more optimal manner. In particular it is possible to store data that needs to be accessed more frequently, at a higher rate, and/or by several of the processing units 182 simultaneously, in the higher bandwidth memory section 185 and data that needs to be accessed less frequently, at a lower rate and/or by fewer or none of the processing units 182 simultaneously, in the lower bandwidth memory section 189. This approach makes it possible to minimize the total memory bandwidth for a given level of performance, thus reducing or minimizing cost (and/or maximizing or improving performance for a given cost).

In an embodiment, data associated with portions of the desired device pattern that repeat in a direction substantially perpendicular to the scanning direction, such that they may need to be accessed simultaneously by different processing units 182, is stored in the higher bandwidth section 185, for example in each of the local memories 184 in an arrangement of the type shown in FIG. 15. In an embodiment, primitive patterns that have one or more instances in each of two or more of the strips may be stored in the higher bandwidth section 185. In an embodiment, primitive patterns that have one or more instances in each of a majority of the strips may be stored in the higher bandwidth section 185. In an embodiment primitives that have instances in more than two (or in a majority of) the strips, and which overlap with each other in the direction substantially perpendicular to the scanning direction, may be stored in the higher bandwidth section 185.

In an embodiment configured to deal with device layouts of the type shown in FIGS. 9 and 10, in the case where the scanning direction is horizontally left to right, data associated with the pixels 154 and with the segments 138 and 139 of border regions that are substantially perpendicular to the scanning direction are stored in the higher bandwidth section 185. In contrast, data associated with the segments 140-145, which are aligned substantially parallel to the scanning direction (and which will thus rarely be needed by a large number of different processing units 182 simultaneously) are stored in the lower bandwidth memory section 189, for example in each of the shared memories 188 in an arrangement of the type shown in FIG. 15.

In an embodiment, data associated with portions of the desired device pattern that have lower levels of feature repetition within them (and/or higher entropy) than the average of the device pattern, and which are elongate in the direction substantially perpendicular to the scanning direction, are stored in the higher bandwidth section 185. Examples of such portions are border regions (or segments thereof) in a flat panel display device pattern (e.g. segments 138 and 139). The amount of data per unit area of pattern to represent such portions will be relatively high (even using hierarchy/compression). The elongation substantially perpendicular to the scanning direction tends to mean that the data will need to be accessed at a high rate and/or by a plurality of processing units simultaneously. The use of the higher bandwidth section 189 is therefore advantageous for such portions.

In an embodiment, data associated with portions of the desired device pattern that have lower levels of repetition within them (and/or higher entropy) than the average within the pattern, but which are not elongate in the direction substantially perpendicular to the scanning direction, are stored in the lower bandwidth section 189. Examples of such portions are border regions (or segments thereof) in a flat panel display device pattern (e.g. segments 140-145). Although the amount of data per unit area of pattern to represent such portions will be high, the lack of elongation substantially perpendicular to the scanning direction will tend to reduce the rate at which the data will be accessed for the data-path calculations and/or the number of processing units that will access the data simultaneously.

In an embodiment, the repeating portions of device pattern for which data is selectively stored in the lower bandwidth memory section 189 or the higher bandwidth memory section 185 have surface areas that are greater than a minimum threshold size. In an embodiment, the minimum threshold size is about $10^4 \times$(critical dimension)$^2$. Here, "critical dimension", which may be referred to as "CD", refers to the resolution of the apparatus being used or the characteristic length scale of the smallest structure that can be imaged or formed in or on the substrate by the apparatus. In an embodiment, the critical dimension is about 1 micron. In an example of such an embodiment, the minimum threshold size is about $10^4 \times$(micron)$^2$. In an embodiment, portions of the desired device pattern that are smaller than the minimum threshold size are aggregated together to form portions that are larger than the minimum threshold size. In an embodiment, this aggregation processing is performed by the rasterization unit 104. In an embodiment, the rasterized primitives output by the rasterization unit 104 as part of the hierarchical rasterized representation comprise rasterized versions of the aggregated patterns.

A representation of the desired dose pattern having a hierarchy (rasterized or not rasterized) cannot generally be stored in memory in the order in which the data will need to be accessed during exposure or in processing steps shortly before exposure. If the hierarchy is still present in the online part of the datapath, it can be difficult and/or expensive to provide hardware that can process the hierarchical representation sufficiently quickly to achieve the desired throughput.

In an embodiment, an apparatus and method is provided to implement "just in time" image reconstruction of only the part of the desired dose pattern that will be formed on the substrate within a certain (e.g., predetermined) time period. In an embodiment, the time period is set according to available memory and memory bandwidth.

Figure 16:
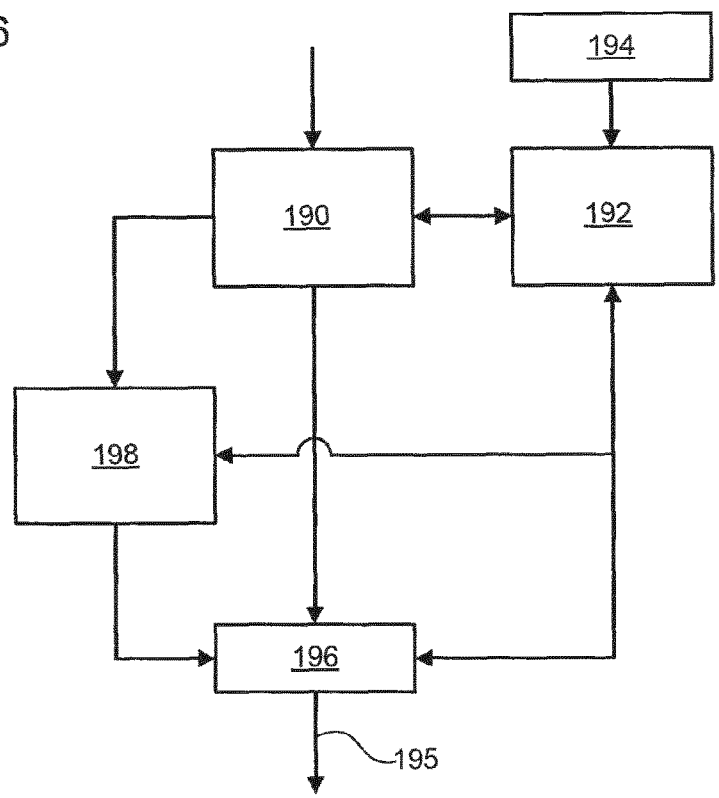
FIG. 16 depicts a resource unit, a buffer memory and a flow controller configured to control transfer of data units to and/or from the buffer memory.

FIG. 16 illustrates a portion of the datapath according to an embodiment. A resource stage 190 is provided. The resource stage 190 provides, on demand, data units. Each of these data units represents a different portion of a desired dose pattern. In an embodiment, the resource stage 190 comprises a memory storing the data units. In an embodiment, the resource unit 190 is in communication with a memory storing the data units. A buffer memory 196 is provided that receives data units from the resource stage 190. The buffer memory 196 outputs 195 the data units as needed (e.g. "just in time") to provide a control signal to the programmable patterning device. In an embodiment, the buffer memory 196 has a limited size but high bandwidth. In an embodiment, the output 195 is provided directly to the programmable patterning device. In an embodiment, the output 195 is provided to an intermediate processing device that will process the output further before the output is used to drive the programmable patterning device. In an embodiment, the output 195 is provided in real time (i.e. in the online part of the datapath, during at least part of the exposure process).

In an embodiment, a flow controller 192 is provided that controls the transfer of data units to and/or from the buffer memory 196. In an embodiment, the control is such that each data unit is stored in the buffer memory 196 for a time period that is shorter than the time necessary to expose the complete desired dose pattern. The size of the buffer memory 196, relative to a memory that stores the complete desired dose pattern, is thereby reduced.

In an embodiment, the desired dose pattern is divided into portions. In an embodiment, each portion is represented by one data unit. The portions may be referred to as blocks. In an embodiment, one block has the substantially same size as at least one other block. In an embodiment, all of the blocks have the substantially same size. In an embodiment, one block has the substantially same shape as at least one other block. In an embodiment, all of the blocks have the substantially same shape. In an embodiment, one block has the substantially same orientation as at least one other block. In an embodiment, all of the blocks have the substantially same orientation. In an embodiment, all blocks that are within a given strip of the desired dose pattern have the substantially same shape and/or orientation. In an embodiment, blocks in different strips have a different shape and/or orientation. In an embodiment, each strip is aligned substantially parallel to a direction of scanning of the substrate relative to the patterning device. In an embodiment, each strip corresponds to the region where spot exposures from a single, mechanically distinct patterning device or portion of the patterning device are received.

In an embodiment, individual structures of the desired dose pattern are not restricted to being located entirely within one block. Individual features may span a plurality of blocks. In an embodiment, individual structures are not aligned with the blocks and/or with the rasterization grid. In an embodiment, the data processing device 100 performs stitching between structures that span a plurality of blocks, are not aligned to the blocks and/or are not aligned to the rasterization grid.

In an embodiment, each block comprises a rectangular or square grid of points in a rasterization grid. In an embodiment, each block comprises 32×32 points. In an embodiment, each block comprises 16×16 points. In an embodiment, each block comprises 32×16 points. In an embodiment, each block contains a number of points other than 32×32, 16×16, or 32×16 points.

In an embodiment, each data unit comprises a hierarchical, compressed representation of the desired dose pattern in a block. In an embodiment, the hierarchical representation is a rasterized representation. In an embodiment, the rasterized representation comprises one or more rasterized primitives and instance data. Each rasterized primitive is a rasterized version of a different primitive pattern. The instance data specifies how the portion of the desired dose pattern in the block is formed from one or more instances of each of the rasterized primitives stored in the data unit.

In an embodiment, the flow controller 192 receives information specifying the one more or more positions at which the portion of the dose pattern specified in each data unit should be formed on a target (e.g., the substrate). In an embodiment, this information is derived, at least partly, from the data units themselves (e.g. from the instance data).

In an embodiment, the flow controller 192 is configured to receive input from a calibration unit 194. In an embodiment, the calibration unit 194 provides information about the state of the substrate. In an embodiment, the information about the state of the substrate is derived from measurements of the state of the substrate. In an embodiment, the information about the state of the substrate is specified by an operator. In an embodiment, the state of the substrate includes the position and/or speed of the substrate (e.g. relative to the programmable patterning device or other reference frame that is fixed relative to the installation environment of the lithography apparatus). In an embodiment, the state of the substrate includes distortion of the substrate and/or the orientation of the substrate. In an embodiment, the distortion/orientation includes one or more selected from the following: magnification, translation, rotation, and/or skew. In an embodiment, the calibration unit 194 also provides information about the state of the projection system optics. In an embodiment, the orientation of the projection system optics, for example relative to the orientation of the substrate, is provided.

In an embodiment, the flow controller 192 controls the transfer of data units to and/or from the buffer memory 196 as a function of one or more factors that affect when the data units will be needed. In an embodiment, information about such factor(s) is provided by the calibration unit 194. In an embodiment, the flow controller 192 controls the transfer of data units to and/or from the buffer memory 196 as a function of one or more of the following: 1) the speed of scanning of the substrate relative to the programmable patterning device; and 2) the degree of magnification of the desired dose pattern on a target (e.g., the substrate). In this way, the average time for which data units are stored in the buffer memory 196 is reduced. The size and/or bandwidth requirements of the buffer memory 196 can thus be reduced.

In an embodiment, a substrate adaptation unit 198 is provided. In an embodiment, the flow controller 192 controls the transfer of data units from the substrate adaptation unit 198 to the buffer memory 196. In an embodiment, the substrate adaptation unit 198 receives data units from the resource unit 190. In an embodiment, the substrate adaptation unit 198 applies a transformation (e.g. a geometric transformation) to received data units. In an embodiment, the transformation corrects the data units to take account of a geometrical state of the substrate (relative to the geometrical state, for example orientation, of the projection system optics for example). In an embodiment, information about the geometrical state of the substrate is provided by the flow controller 192 and/or the calibration unit 194. In an embodiment, the transformation corrects each data unit to account for the geometrical state of the substrate in the region where the pattern corresponding to the data unit will be formed. In an embodiment, the geometrical state of the substrate includes one or more selected from the following: the orientation of the substrate, a translational shift, a rotational shift, a skew, and/or magnification.

Adapting/transforming the data units, downstream of the resource unit 190, to take account of the geometrical state of the substrate reduces the extent to which the data units provided by the resource unit 190 need to be substrate dependent. Reducing the substrate dependence reduces the extent to which the data units need to be adapted at the level of the resource unit 190 when a substrate is changed, thus potentially reducing data processing requirements. In the limit that the geometrical state of the substrate is completely accounted for, the data units provided by the resource unit 190 can be substrate independent. Making the data units substrate independent means that the data units do not need to be reloaded when a substrate is changed, thus reducing processing load at substrate changeover and/or speeding up the substrate changeover processing and/or improving throughput.

Adapting/transforming the data units, downstream of the resource unit 190, to take account of the orientation of the substrate makes it possible to deal efficiently with different orientations of the substrate (e.g. orientations that differ from one substrate to the next, orientations that are not rectangular and/or orientations which are not aligned in the same direction as the desired dose pattern or the blocks making up the desired dose pattern). Different orientations can be handled without changing any of the data processing operations at or prior to the resource unit 190.

Taking account of the substrate speed downstream of the resource unit 190 makes it possible to deal with different scanning speeds without changing any of the data processing operations at or prior to the resource unit 190.

In an embodiment, one or more regions of the dose pattern comprise blank regions. In an embodiment, the blank regions are located in the region of a substrate edge. In an embodiment, such blank regions are represented by "black" blocks or blocks containing uniformly zero intensity/dose. A single data unit representing such a black block can be reused repeatedly to form the blank regions, thus improving efficiency.

In an embodiment, the resource unit 190 is configured to handle one or more data units that are substrate independent and one or more data units that are substrate dependent. In an embodiment, the substrate independent data units and the substrate dependent data units are processed downstream from the resource unit 190 according to the discussion above (e.g. to compensate for scan speed and/or a geometrical state/orientation of the particular substrate). In an embodiment, the substrate independent data units represent blocks of the desired dose pattern that are identical for a plurality of different substrates. In an embodiment, the substrate dependent data units represent blocks of the desired dose pattern that are unique to the particular substrate being exposed, such as blocks representing all or part of a serial number of the substrate. Enabling the resource unit 190 to handle both substrate dependent and substrate independent data makes it possible to efficiently handle desired dose patterns that are identical for a series of substrates except for small unique features such as serial numbers. Only the substrate dependent data needs to be loaded into memory on, e.g., substrate exchange. The bulk of the data does not have to be reloaded.

The process of converting a vector-based representation of a desired device pattern to a rasterized or sampled representation of the corresponding dose pattern can involve significant computing resources. Handling of the obtained rasterized or sampled representation may require significant storage requirements. Transmission or communication of the obtained rasterized or sampled representation may require significant transmission bandwidth. Processing of the obtained rasterized or sampled representation, for example to produce setpoint data for a programmable patterning device, may require significant processing power.

In an embodiment the rasterization process is performed based on a rasterization or sampling grid. The rasterization or sampling grid defines the points or locations at which the rasterized or sampled representation defines desired dose values (i.e. sampling). In an embodiment, the rasterization or sampling grid is defined by one or more basis functions. In an embodiment, such a basis function comprises one or more selected from the following: Dirac delta function pulse, spline, Fourier series, and/or polynomials.

In an embodiment an analysis of a region of the desired device pattern is performed in order to obtain a measure of a computational requirement to obtain, to store or to process the rasterized or sampled representation corresponding to that region. In an embodiment, an analysis of a simulated or actual dose pattern produced using the rasterized or sampled representation corresponding to that region is performed.

In an embodiment, the rasterization or sampling grid is modified based on the analysis. In an embodiment, the rasterization or sampling grid is modified to change the geometry of the rasterization or sampling grid. In an embodiment, the rasterization or sampling grid is modified to change a basis function of the rasterization or sampling grid. In an embodiment, the rasterization or sampling grid is modified to change the density of the rasterization or sampling grid.

In an embodiment, if the analysis reveals that one or more computational requirements to handle the rasterized or sampled representation is/are not sufficiently well matched to an available resource, the rasterization or sampling grid is modified to improve the match. In an embodiment, the density of the rasterization or sampling grid (represented, for example, by the average number of grid points per unit area) is decreased if the analysis reveals that the computational requirement is too high (such that an available resource would be overused). In an embodiment, the density of the rasterization or sampling grid is increased if the analysis reveals that the computational requirement is too low (such that an available resource would be underused).

In an embodiment, the analysis of the simulated or actual dose pattern comprises an analysis of the image quality of the simulated or actual dose pattern. The rasterization or sampling grid is then modified to achieve a desired level of image quality. In an embodiment, if the image quality is too low the rasterization or sampling grid is modified to increase the image quality (e.g. by increasing the grid density). In an embodiment, if the image quality is unnecessarily high the rasterization or sampling grid is modified to decrease the image quality (e.g. by decreasing the grid density). In an embodiment, the image quality is analyzed to determine a line edge roughness, or a normalized image log slope (NILS), or both.

The quality of the dose pattern may thereby be maximized for the resources available. In an embodiment, the modification of the rasterization or sampling grid is applied independently for different regions in order to optimize image quality for all of the different regions. In an embodiment, the rasterization grid in different regions has different densities, geometries and/or basis functions.

Figure 17:
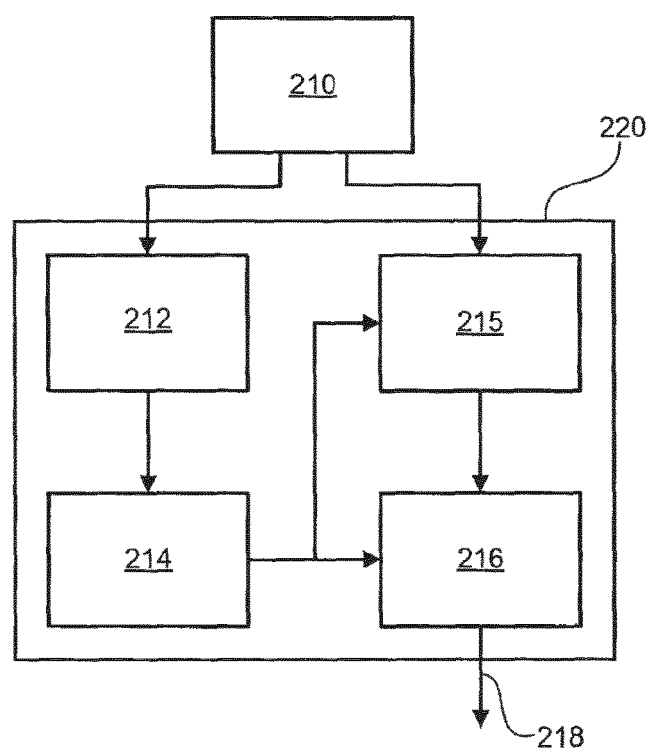
FIG. 17 depicts an apparatus to convert a vector-based representation to a rasterized or sampled representation.

FIG. 17 is a schematic illustration of an example apparatus to convert a vector-based representation to a rasterized or sampled representation. A storage device 210 is configured to store the vector-based representation and provide the vector-based representation or portions thereof to a data processing device 220. The data processing device 220 of this embodiment comprises an analyzer 212 configured to analyze a region of the desired device pattern to obtain a measure of a computational requirement to handle that region or to analyze a simulated or actual dose pattern produced using a rasterized or sampled representation of the region. The analyzer 212 outputs a result of the analysis to a grid modifying unit 214. The grid modifying unit 214 determines whether the rasterization or sampling grid should be modified and, if so, how the rasterization or sampling grid should be modified.

In an embodiment, the data processing device 220 comprises a low-pass filter 215 (which may also be referred to as an anti-aliasing filter) and a rasterizer 216. The low pass filter 215 is configured to filter the desired device pattern to remove one or more high spatial frequency components. In an embodiment, the low pass filter 215 is characterized by a cut-off frequency or range of frequencies (representing the frequency range over which the low pass filter behavior changes from substantially blocking to substantially passing frequency components). The low pass filter 215 substantially passes frequency components of an input signal that are below the cut-off frequency or range of frequencies. The low pass filter 215 substantially blocks frequency components of an input signal that are above the cut-off frequency or range of frequencies.

In an embodiment, the rasterizer 216 is configured to rasterize or sample a version of the desired device pattern that has been filtered by the low pass filter 215.

In an embodiment, the behavior of the low pass filter 215 (e.g. cut-off frequency or range of frequencies) is chosen as a function of the rasterization or sampling grid to be used to perform the rasterization. In an embodiment, the filter behavior is chosen such that aliasing caused by insufficient sampling of the filtered dose pattern by the rasterization or sampling grid is avoided.

In an embodiment, the modified rasterization or sampling grid generated by the grid modifying unit 214 is output to the low pass filter 215 (to enable the filter characteristics to be selected accordingly) and to the rasterizer 216 (for use in performing the rasterization).

In an embodiment, the output 218 from the rasterizer 216 is used to generate a sequence of setpoint data to drive a programmable patterning device of an exposure apparatus.

Figure 18:
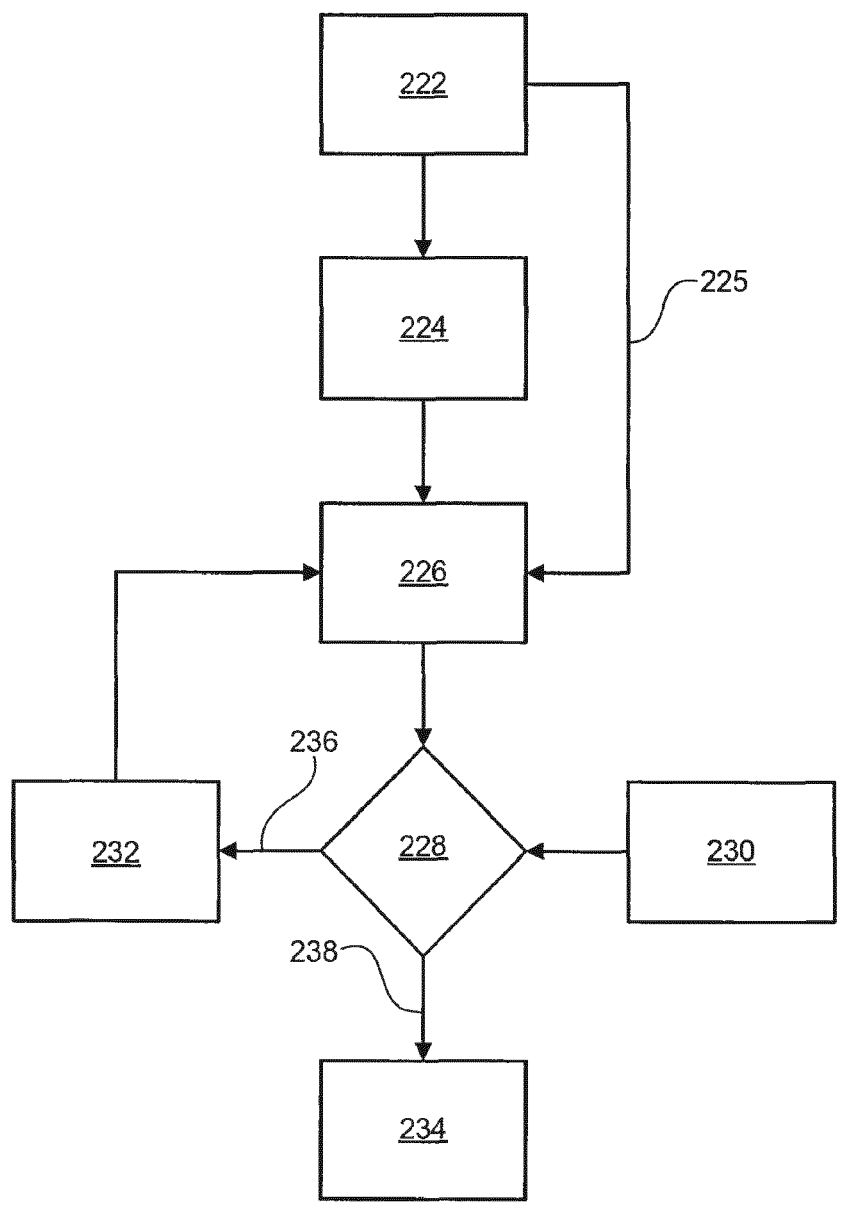
FIG. 18 depicts an example process to obtain an optimized rasterization or sampling grid.

FIG. 18 depicts an example process to obtain a modified rasterization or sampling grid. In an embodiment, the process depicted is performed by the storage device 210, analyzer 212, grid modifying unit 214, and low pass filter 215 of the embodiment of FIG. 17. In an embodiment, the output is passed to rasterizer 216 of the embodiment depicted in FIG. 17.

In step 222, a vector-based representation of a desired device pattern is provided (for example from the storage device 210).

In filter step 224, the desired device pattern is optionally low pass filtered (for example using low pass filter 215). In an alternative embodiment, the filtering operation does not form part of the process to obtain the modified rasterization or sampling grid and step 222 proceeds directly to step 226, bypassing step 224 (path 225).

In analysis step 226, a region of the desired device pattern is analyzed to obtain a measure of a computation requirement needed to obtain, to store, or to process a rasterized or sampled representation of the region, or a simulated or actual dose pattern produced using a rasterized or sampled representation of the region is analyzed to obtain a measure of image quality.

In comparison step 228, the obtained measure of a computational requirement or image quality is compared with a stored target computational requirement or target image quality 230. If the comparison reveals that the obtained measure is too low or too high (branch 236), the rasterization or sampling grid is modified (step 232) and the modified rasterization or sampling grid is provided to the analysis step 226. The analysis step 226 repeats the analysis performed previously based on the new rasterization or sampling grid.

If the comparison in comparison step 228 reveals that the obtained measure is within an acceptable error margin of the stored target requirement 230, or a certain (e.g., predetermined) number of iterations (loops through steps 226, 228 and 232) has been performed, the process takes branch 238 and outputs the current modified rasterization or sampling grid in output step 234 (assuming the comparison step 228 was not satisfied the first time, in which case the initial unmodified rasterization or sampling grid is output).

In an embodiment, the analysis to obtain a measure of the computational requirement or image quality is performed for a plurality of distinct regions individually. In an embodiment, a portion of the rasterization or sampling grid corresponding to each of the individually analyzed regions is modified individually. In an embodiment, the density of the rasterization or sampling grid is modified to be higher in a region corresponding to a more complex, or higher resolution, area of device pattern (or a region that requires a denser rasterization or sampling grid to produce a dose pattern suitable for forming the device pattern in the region to a certain level of accuracy) relative to a region corresponding to a less complex, or lower resolution, area of the device pattern (or a region that requires a less dense rasterization or sampling grid to produce a dose pattern suitable for forming the device pattern in the region to a certain level of accuracy). The rasterization or sampling grid density can thus be varied spatially to adapt to one or more requirements (e.g. line edge roughness and/or normalized image log slope) of the desired device pattern. The total number of grid points in the rasterization or sampling grid can be reduced relative to the case where the rasterization or sampling grid has a uniform density in all regions. Oversampling of a region where the pattern should only require relatively sparse sampling is more easily avoided. Undersampling of a region where the pattern should require relatively dense sampling is more easily avoided.

In an embodiment, the computational requirement referred to above includes one or more selected from the following: a storage requirement (e.g. physical memory size requirement), a bandwidth requirement (e.g. for transmission of the rasterized data), and/or a processing requirement (e.g. for downstream processing of the rasterized representation, for example to produce setpoint data for a programmable patterning device or intermediate data that can be used to produce the setpoint data).

In accordance with a device manufacturing method, a device, such as a display, integrated circuit or any other item may be manufactured from the substrate on which the pattern has been projected.

Although specific reference may be made in this text to the use of a lithographic or exposure apparatus in the manufacture of ICs, it should be understood that the apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The term "lens", where the context allows, may refer to any one of various types of optical components, including refractive, diffractive, reflective, magnetic, electromagnetic and electrostatic optical components or combinations thereof.

While specific embodiments of the invention have been described above, it will be appreciated that the invention may be practiced otherwise than as described. For example, the embodiments of the invention may take the form of a computer program containing one or more sequences of machine-readable instructions describing a method as disclosed above, or a data storage medium (e.g. semiconductor memory, magnetic or optical disk) having such a computer program stored therein. Further, the machine-readable instruction may be embodied in two or more computer programs. The two or more computer programs may be stored on one or more different memories and/or data storage media.

The descriptions above are intended to be illustrative, not limiting. Thus, it will be apparent to one skilled in the art that modifications may be made to the invention as described without departing from the scope of the claims set out below.

The invention claimed is:

1. An apparatus to provide data to a programmable patterning device of an exposure apparatus, the apparatus comprising:
   a processor system comprising instructions, that when executed by the processor system, configured to convert a vector-based representation of at least part of a desired exposure pattern to a plurality of data units, wherein each data unit represents a pattern to be formed in a different portion of a desired dose pattern corresponding to the desired exposure pattern, wherein each data unit comprises a rasterized representation of the portion of the desired dose pattern, the rasterized representation comprising one or more rasterized primitives of the dose pattern, each rasterized primitive being a rasterized version of a different primitive pattern, and wherein each data unit comprises instance data specifying how the portion of the desired dose pattern is formed from one or more instances of each of the rasterized primitives stored in the data unit;
   a buffer memory configured to receive the plurality of data units determined by the processor system, wherein the buffer memory is configured to output the data units as needed to provide a control signal to the programmable patterning device during pattern formation of a particular substrate by the exposure apparatus;
   a flow controller configured to control transfer of the data units to and/or from the buffer memory; and
   a control signal generator configured to process the rasterized representations of the data units based on instance data of the data units to generate the control signal from the data units.

2. The apparatus according to claim 1, wherein the flow controller is configured to receive information specifying one or more positions at which each of the portions of the desired dose pattern should be formed on a target.

3. The apparatus according to claim 1, wherein each portion of the desired dose pattern is substantially the same size and/or shape.

4. The apparatus according to claim 1, wherein the flow controller is configured to control a rate at which the data units are transferred to the buffer memory as a function of a scanning speed of the substrate relative to the programmable patterning device, a degree of magnification of the desired dose pattern on a target, or both the speed of scanning and the degree of magnification.

5. The apparatus according to claim 1, wherein:
the flow controller is configured to ensure that the buffer memory stores data units for only those portions of the desired dose pattern that will be formed within a certain period of time; and
the flow controller is configured to set the period of time as a function of a scanning speed of the substrate relative to the programmable patterning device, a degree of magnification of the desired dose pattern on a target, or both the speed of scanning and the degree of magnification.

6. The apparatus according to claim 1, further comprising a substrate adaptation unit configured to apply a geometric transformation to each of one or more of the data units to account for a geometrical state of the substrate in the region where the portion of the desired dose pattern represented by the data unit is to be formed.

7. The apparatus according to claim 6, wherein the geometric transformation comprises one or more selected from the following: a translational shift, a rotational shift, a skew adjustment, and/or a magnification.

8. The apparatus according to claim 1, further comprising a resource unit configured to provide all of the data units, wherein the resource unit is configured to output one or more data units that are substrate independent and one or more data units that are substrate dependent.

9. A method of providing data to a programmable patterning device of an exposure apparatus, the method comprising:
using a processor system, converting a vector-based representation of at least part of a desired exposure pattern to a plurality of data units, wherein each data unit represents a pattern to be formed in a different portion of a desired dose pattern corresponding to the desired exposure pattern, wherein each data unit comprises a rasterized representation of the portion of the desired dose pattern, the rasterized representation comprising one or more rasterized primitives of the dose pattern, each rasterized primitive being a rasterized version of a different primitive pattern, and wherein each data unit comprises instance data specifying how the portion of the desired dose pattern is formed from one or more instances of each of the rasterized primitives stored in the data unit;
in a buffer memory, receiving the plurality of data units determined using the processor system;
outputting the data units from the buffer memory as needed to provide a control signal to the programmable patterning device during pattern formation of a particular substrate by the exposure apparatus;
controlling transfer of the data units to and/or from the buffer memory; and
processing the rasterized representations of the data units based on instance data of the data units to generate the control signal from the data units.

10. The method according to claim 9, wherein the control of transfer of the data units comprises using information specifying one or more positions at which each of the portions of the desired dose pattern should be formed on a target.

11. The method according to claim 9, further comprising applying a geometric transformation to each of one or more of the data units to account for a geometrical state of the substrate in the region where the portion of the desired dose pattern represented by the data unit is to be formed.

12. The method according to claim 9, further comprising:
ensuring that the buffer memory stores data units for only those portions of the desired dose pattern that will be formed within a certain period of time; and
setting the period of time as a function of a scanning speed of the substrate relative to the programmable patterning device, a degree of magnification of the desired dose pattern on a target, or both the speed of scanning and the degree of magnification.

13. The method according to claim 9, wherein each portion of the desired dose pattern is substantially the same size and/or shape.

14. The method according to claim 9, wherein the controlling transfer of the data units comprises controlling a rate at which the data units are transferred to the buffer memory as a function of a scanning speed of the substrate relative to the programmable patterning device, a degree of magnification of the desired dose pattern on a target, or both the speed of scanning and the degree of magnification.

15. A non-transitory computer-readable medium comprising instructions configured to, when executed, cause at least:
using a processor system unit, conversion of a vector-based representation of at least part of a desired exposure pattern to a plurality of data units, wherein each data unit represents a pattern to be formed in a different portion of a desired dose pattern corresponding to the desired exposure pattern, wherein each data unit comprises a rasterized representation of the portion of the desired dose pattern, the rasterized representation comprising one or more rasterized primitives of the dose pattern, each rasterized primitive being a rasterized version of a different primitive pattern, and wherein each data unit comprises instance data specifying how the portion of the desired dose pattern is formed from one or more instances of each of the rasterized primitives stored in the data unit;
in a buffer memory, receipt of the plurality of data units determined using the processor system;
output of the data units from the buffer memory as needed to provide a control signal to a programmable patterning device during pattern formation of a particular substrate by an exposure apparatus;
control of the transfer of the data units to and/or from the buffer memory; and
processing of the rasterized representations of the data units based on instance data of the data units to generate the control signal from the data units.

16. The non-transitory computer-readable medium according to claim 15, wherein the control of transfer of the data units comprises control of a rate at which the data units are transferred to the buffer memory as a function of a scanning speed of the substrate relative to the programmable patterning device, a degree of magnification of the desired dose pattern on a target, or both the speed of scanning and the degree of magnification.

17. The non-transitory computer-readable medium according to claim 15, wherein the control of transfer of the data units comprises using information specifying one or more positions at which each of the portions of the desired dose pattern should be formed on a target.

18. The non-transitory computer-readable medium according to claim 15, wherein each portion of the desired dose pattern is substantially the same size and/or shape.

19. The non-transitory computer-readable medium according to claim 15, wherein the instructions are further configured to, when executed, cause application of a geometric transformation to each of one or more of the data units to account for a geometrical state of the substrate in the region where the portion of the desired dose pattern represented by the data unit is to be formed.

20. The non-transitory computer-readable medium according to claim 19, wherein the geometric transformation comprises one or more selected from the following: a translational shift, a rotational shift, a skew adjustment, and/or a magnification.

* * * * *